US012666705B2

(12) United States Patent (10) Patent No.: US 12,666,705 B2
Naik et al. (45) Date of Patent: Jun. 23, 2026

(54) TRENCH GATE NMOS TRANSISTOR AND TRENCH GATE PMOS TRANSISTOR MONOLITHICALLY INTEGRATED IN SAME SEMICONDUCTOR DIE

(71) Applicant: Infineon Technologies Austria AG, Villach (AT)

(72) Inventors: Harsh Naik, El Segundo, CA (US); Timothy Henson, Mount Shasta, CA (US); Honghai He, Redondo Beach, CA (US); Robert Haase, San Pedro, CA (US); Ashita Mirchandani, Torrance, CA (US); Alireza Mojab, El Segundo, CA (US)

(73) Assignee: Infineon Technologies Austria AG, Villach (AT)

( * ) Notice: Subject to any disclaimer, the term of this patent is extended or adjusted under 35 U.S.C. 154(b) by 782 days.

(21) Appl. No.: 17/957,035

(22) Filed: Sep. 30, 2022

(65) Prior Publication Data

US 2024/0113115 A1 Apr. 4, 2024

(51) Int. Cl.
*H10D 30/01* (2025.01)
*H02M 1/088* (2006.01)
(Continued)

(52) U.S. Cl.
CPC ............ *H10D 84/85* (2025.01); *H02M 1/088* (2013.01); *H10D 30/0289* (2025.01);
(Continued)

(58) Field of Classification Search
CPC ............. H10D 30/658; H10D 84/0188; H10D 30/0295; H10D 30/0297; H10D 30/663;
(Continued)

(56) References Cited

U.S. PATENT DOCUMENTS 6,410,376 B1 * 6/2002 Ng .................... H10D 84/0177
257/E21.642
2005/0062101 A1 3/2005 Sugi et al.
(Continued)

FOREIGN PATENT DOCUMENTS

EP 4250359 A1 9/2023
JP H03145761 A 6/1991

OTHER PUBLICATIONS

Ohno, T., et al., "An Intelligent Power IC with Double Buried-Oxide Layers Formed by SIMOX Technology", IEEE Transactions on Electron Devices, vol. 40, No. 11, Nov. 1993, pp. 2074-2079.

*Primary Examiner* — Jessica S Manno
*Assistant Examiner* — Sandra Milena Rodriguez Villanu
(74) *Attorney, Agent, or Firm* — Murphy, Bilak & Homiller, PLLC

(57) ABSTRACT

A semiconductor die includes: a silicon substrate; a trench gate NMOS transistor formed in a first device region of the silicon substrate; a trench gate PMOS transistor formed in a second device region of the silicon substrate and electrically connected to the trench gate NMOS transistor; and an isolation structure interposed between the first device region and the second device region. Methods of monolithically integrating the trench gate NMOS transistor and the trench gate PMOS transistor in the same semiconductor die are also described.

19 Claims, 20 Drawing Sheets

(51) Int. Cl.

| | |
|---|---|
| *H10D 30/65* | (2025.01) |
| *H10D 64/00* | (2025.01) |
| *H10D 84/01* | (2026.01) |
| *H10D 84/03* | (2025.01) |
| *H10D 84/85* | (2025.01) |
| *H10P 30/20* | (2026.01) |
| *H10P 30/22* | (2026.01) |

(52) U.S. Cl.

CPC ......... *H10D 30/658* (2025.01); *H10D 64/117* (2025.01); *H10D 84/0186* (2025.01); *H10D 84/0188* (2025.01); *H10D 84/038* (2025.01); *H10P 30/204* (2026.01); *H10P 30/21* (2026.01); *H10P 30/22* (2026.01)

(58) Field of Classification Search

CPC .. H10D 30/668; H10D 64/256; H10D 64/516; H10D 84/0195; H10D 84/839; H10D 84/0165; H10D 64/513; H10D 30/0289; H02M 3/00; H02M 1/00; Y02B 70/10

See application file for complete search history.

(56) References Cited

U.S. PATENT DOCUMENTS

| | | | |
|---|---|---|---|
| 2005/0087800 A1 | 4/2005 | Sugi et al. | |
| 2013/0140673 A1 | 6/2013 | Haeberlen et al. | |
| 2014/0319602 A1 | 10/2014 | Melemeyer et al. | |
| 2017/0070147 A1* | 3/2017 | Childs .................. | H02M 3/158 |

* cited by examiner

TRENCH GATE NMOS TRANSISTOR AND TRENCH GATE PMOS TRANSISTOR MONOLITHICALLY INTEGRATED IN SAME SEMICONDUCTOR DIE

BACKGROUND

Power converters such as DC-DC converters are driven by a gate driver. A controller inputs a low-power signal to the gate driver which produces a high-current drive input for the gate of a high-power transistor such as an IGBT (insulated gate bipolar transistor) or power MOSFET (metal-oxide-semiconductor field-effect transistor). The gate driver monolithically integrated with the power transistor or provided as a discrete device. An integrated gate-driver solution has several advantages, including reduced power loss and increased power conversion efficiency at high frequency. However, the gate driver typically includes both PMOS and NMOS transistors whereas the power transistor is typically an n-channel (NMOS) device, which makes monolithic integration challenging.

Thus, there is a need for an improved chip (die) design that includes both a power NMOS transistor of a power converter and at least one PMOS transistor of a gate driver for the power NMOS transistor monolithically integrated in the same die.

SUMMARY

According to an embodiment of a semiconductor die, the semiconductor die comprises: a silicon substrate; a trench gate NMOS transistor formed in a first device region of the silicon substrate; a trench gate PMOS transistor formed in a second device region of the silicon substrate and electrically connected to the trench gate NMOS transistor; and an isolation structure interposed between the first device region and the second device region.

According to an embodiment of a method of fabricating a semiconductor die, the method comprises: forming a trench gate NMOS transistor in a first device region of a silicon substrate; forming a trench gate PMOS transistor in a second device region of the silicon substrate; forming an isolation structure between the first device region and the second device region; and electrically connecting the trench gate PMOS transistor to the trench gate NMOS transistor.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a chip (die) design that includes both a trench gate NMOS transistor and a trench gate PMOS transistor monolithically integrated in the same semiconductor die. The trench gate PMOS transistor may be, e.g., part of a gate driver. The trench gate NMOS transistor may be, e.g., a complimentary part of the gate driver or a power NMOSFET (n-channel metal-oxide-semiconductor field-effect transistor) that is driven by the gate driver. Other circuit configurations may be realized by utilizing the monolithically integrated trench gate NMOS transistor and trench gate PMOS transistor embodiments described herein.

Described next with reference to the figures are embodiments of the semiconductor die and methods of monolithically integrating a trench gate NMOS transistor and a trench gate PMOS transistor in the same semiconductor die.

Figure 1:
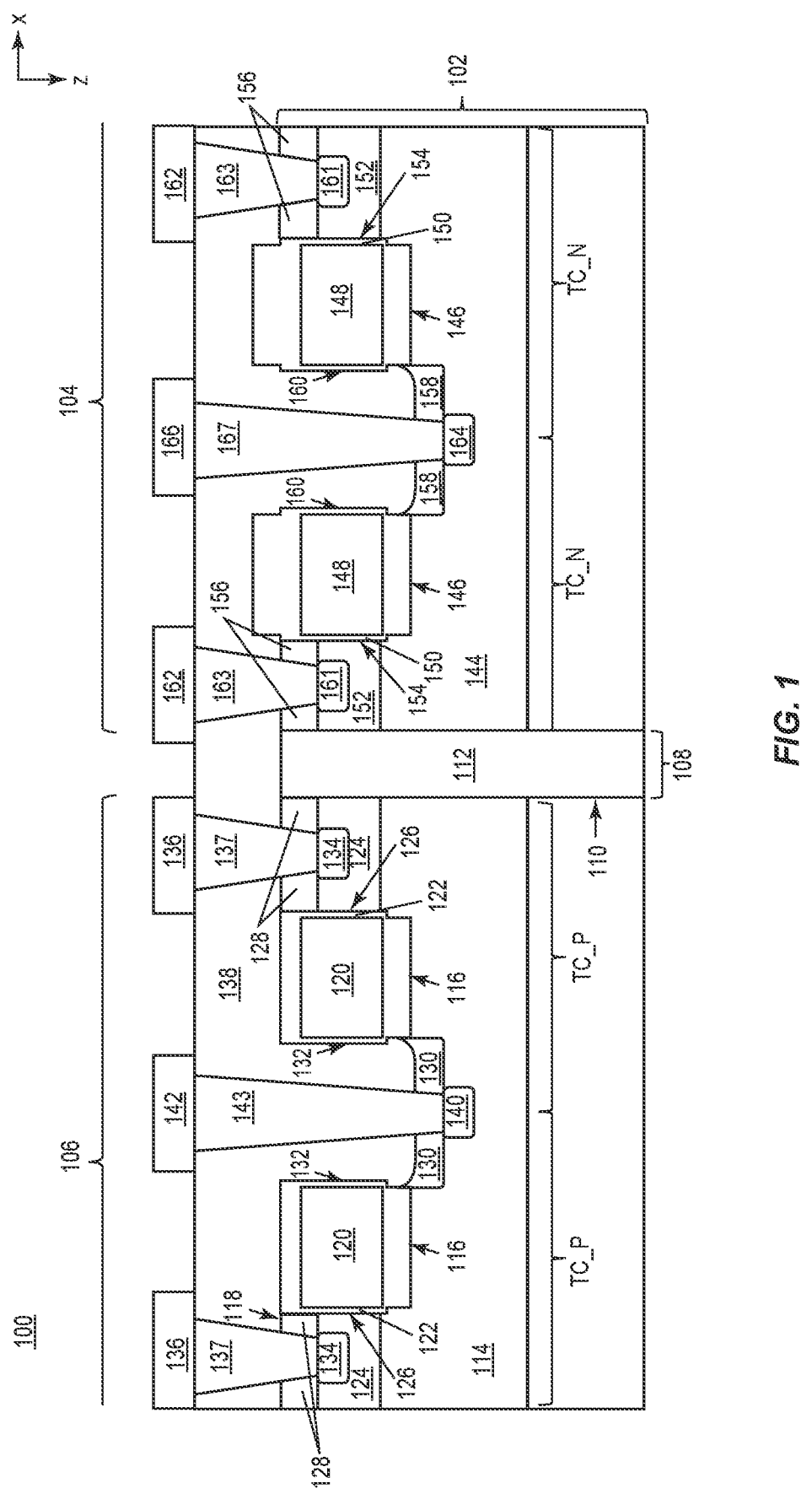
FIG. 1 illustrates a cross-sectional view of part of a semiconductor die (chip) that includes a trench gate NMOS transistor and a trench gate PMOS transistor monolithically integrated in the same die.

FIG. 1 illustrates a cross-sectional view of part of a semiconductor die (chip) 100, according to an embodiment. The semiconductor die 100 includes a silicon (Si) substrate 102. The silicon substrate 102 may be a bulk Si material or may include one or more Si epitaxial layers grown on a bulk Si material.

The silicon substrate 102 has a first device region 104 and a second device region 106. At least one trench gate NMOS (n-channel metal-oxide-semiconductor) transistor is formed in the first device region 104 and at least one trench gate PMOS (p-channel metal-oxide-semiconductor) transistor is formed in the second device region 106. The term 'trench gate' as used herein means that the gate electrode of the corresponding transistor is arranged in a trench etched into the silicon substrate 102 as opposed to a planar gate transistor which has a gate electrode arranged above the front main surface of the silicon substrate 102.

In the partial view of FIG. 1, two cells 'IC N' of a trench gate NMOS transistor are shown in the first device region 104 and two cells 'IC P' of a trench gate PMOS transistor are shown in the second device region 106. The n-channel cells TC_N are electrically coupled in parallel to form the trench gate NMOS transistor and the p-channel cells TC_P are electrically coupled in parallel to form the trench gate PMOS transistor.

Two (2) NMOS transistor cells TC_N and two (2) PMOS transistor cells TC_P are shown in the partial cross-sectional view of FIG. 1. More generally, the trench gate NMOS transistor and the trench gate PMOS transistor may each have one or more cells, depending on the type of device being implemented.

For example, the trench gate NMOS transistor and the trench gate PMOS transistor may have the same or similar cell layout but with opposite conductivity types. In this case, the trench gate NMOS transistor and the trench gate PMOS transistor may form a stage of a gate driver for a power NMOSFET and may have the same number of cells, e.g., TC_N=TC_P≥1, where the number of cells TC_N, TC_P depends on the drive strength of the driver stage. In another example, the trench gate NMOS transistor may be a power NMOSFET and the trench gate PMOS transistor may form part of a stage of the gate driver for the power NMOSFET. In this example, the power NMOSFET has more cells than the trench gate PMOS, i.e., TC_N>TC_P and TC_P≥1. The power NMOSFET may have tens, hundreds, thousands, or even more transistors cells TC_N. Both a power NMOSFET and at least one stage of the corresponding gate driver, including both NMOS and PMOS transistor devices of the driver stage, may be monolithically integrated in the same semiconductor die 100 with the n-channel (NMOS) transistor devices formed in the first device region 104 and each p-channel (PMOS) transistor device formed in the second device region 106.

An isolation structure 108 interposed between the first device region 104 and the second device region 106 ensures adequate isolation between n-channel and p-channel devices within the silicon substrate 102. The isolation structure 108 may include, e.g., a trench 110 filled with an electrically insulative material 112 such as an oxide. For example, the isolation structure 108 may be a deep trench isolation structure that extends through most or all of the depth of the silicon substrate 102.

In FIG. 1, the trench gate PMOS transistor and the trench gate NMOS transistor form a stage of a gate driver for a power NMOSFET. At least one additional stage of the gate driver may not be integrated in the semiconductor die 100, for example. The power NMOSFET driven by the gate driver may be formed in another part of the first device region 104 that is out of view in FIG. 1.

Further according to the embodiment illustrated in FIG. 1, the trench gate PMOS transistor includes a p-type drift region 114 in the second device region 106. First stripe-shaped gate trenches 116 extend from a first main surface 118 of the silicon substrate 102 and terminate at a depth in the p-type drift region 114. The first gate trenches 116 are 'stripe-shaped' in that the first gate trenches 116 have a longest linear dimension in a direction which runs in and out of the page in FIG. 1, parallel to the first main surface 118 of the silicon substrate 102, and transverse to the depth-wise direction (z direction in FIG. 1) of the silicon substrate 102.

A gate electrode 120 in each first stripe-shaped gate trench 116 is dielectrically insulated from the silicon substrate 102 by a gate dielectric 122. An n-type body region 124 is arranged at a first sidewall 126 of each first stripe-shaped gate trench 116. A p-type source region 128 is arranged above the n-type body region 124 at the first sidewall 126 of each first stripe-shaped gate trench 116. A p-type drain region 130 is arranged at a second sidewall 132 of each first stripe-shaped gate trench 116 opposite the first sidewall 126.

In FIG. 1, the first main surface 118 of the silicon substrate 102 is recessed adjacent the second sidewall 132 of the first stripe-shaped gate trenches 116 such that the p-type drain regions 130 are arranged deeper in the silicon substrate 102 than the gate electrodes 120. The second device region

106 may also include an n+ body contact region 134 for providing an ohmic connection between the n-type body regions 124 of the trench gate PMOS transistor and a PMOS source metallization which may include a source power metallization 136 such as Al, Cu, AlCu, etc. on an interlayer dielectric 138 and corresponding electrically conductive vias 137 such as tungsten vias. The second device region 106 may also include a p+ contact region 140 in the p-type drift region 114 for providing an ohmic connection between the p-type drift region 114 of the trench gate PMOS transistor and a PMOS drain metallization which may include a drain power metallization 142 such as Al, Cu, AlCu, etc. on the interlayer dielectric 138 and corresponding electrically conductive vias 143 such as tungsten vias.

Further according to the embodiment illustrated in FIG. 1, the trench gate NMOS transistor has a similar cell layout as the trench gate NMOS transistor but with oppositely doped regions. For example, the trench gate NMOS transistor includes an n-type drift region 144 in the first device region 104. Second stripe-shaped gate trenches 146 extend from the first main surface 118 of the silicon substrate 102 and terminate at a depth in the n-type drift region 144. A gate electrode 148 in each second stripe-shaped gate trench 146 is dielectrically insulated from the silicon substrate 102 by a gate dielectric 150. A p-type body region 152 is arranged at a first sidewall 154 of each second stripe-shaped gate trench 146. An n-type source region 156 is arranged above the p-type body region 152 at the first sidewall 154 of each second stripe-shaped gate trench 146. An n-type drain region 158 is arranged at a second sidewall 160 of each second stripe-shaped gate trench 146 opposite the first sidewall 154.

In FIG. 1, the first main surface 118 of the silicon substrate 102 is recessed adjacent the second sidewall 160 of the second stripe-shaped gate trenches 146 of the trench gate NMOS transistor such that the n-type drain region 158 is arranged deeper in the silicon substrate 102 than the gate electrodes 148 in the second stripe-shaped gate trenches 146. The first device region 104 may also include a p+ body contact region 161 for providing an ohmic connection between the p-type body regions 152 of the trench gate NMOS transistor and an NMOS source metallization 162 which may include a source power metallization 162 such as Al, Cu, AlCu, etc. on the interlayer dielectric 138 and corresponding electrically conductive vias 163 such as tungsten vias. The first device region 104 may also include an n+ contact region 164 in the n-type drift region 144 for providing an ohmic connection between the n-type drift region 144 of the trench gate NMOS transistor and an NMOS drain metallization 166 which may include a drain power metallization 166 such as Al, Cu, AlCu, etc. on the interlayer dielectric 138 and corresponding electrically conductive vias 167 such as tungsten vias.

As explained above, the trench gate PMOS transistor in FIG. 1 may be a high-side switch device of a gate driver stage and the trench gate NMOS transistor may be a low-side switch device of the same gate driver stage. A power NMOSFET driven by the gate driver may be formed in another part of the first device region 104 that is out of view in FIG. 1.

Figure 2:
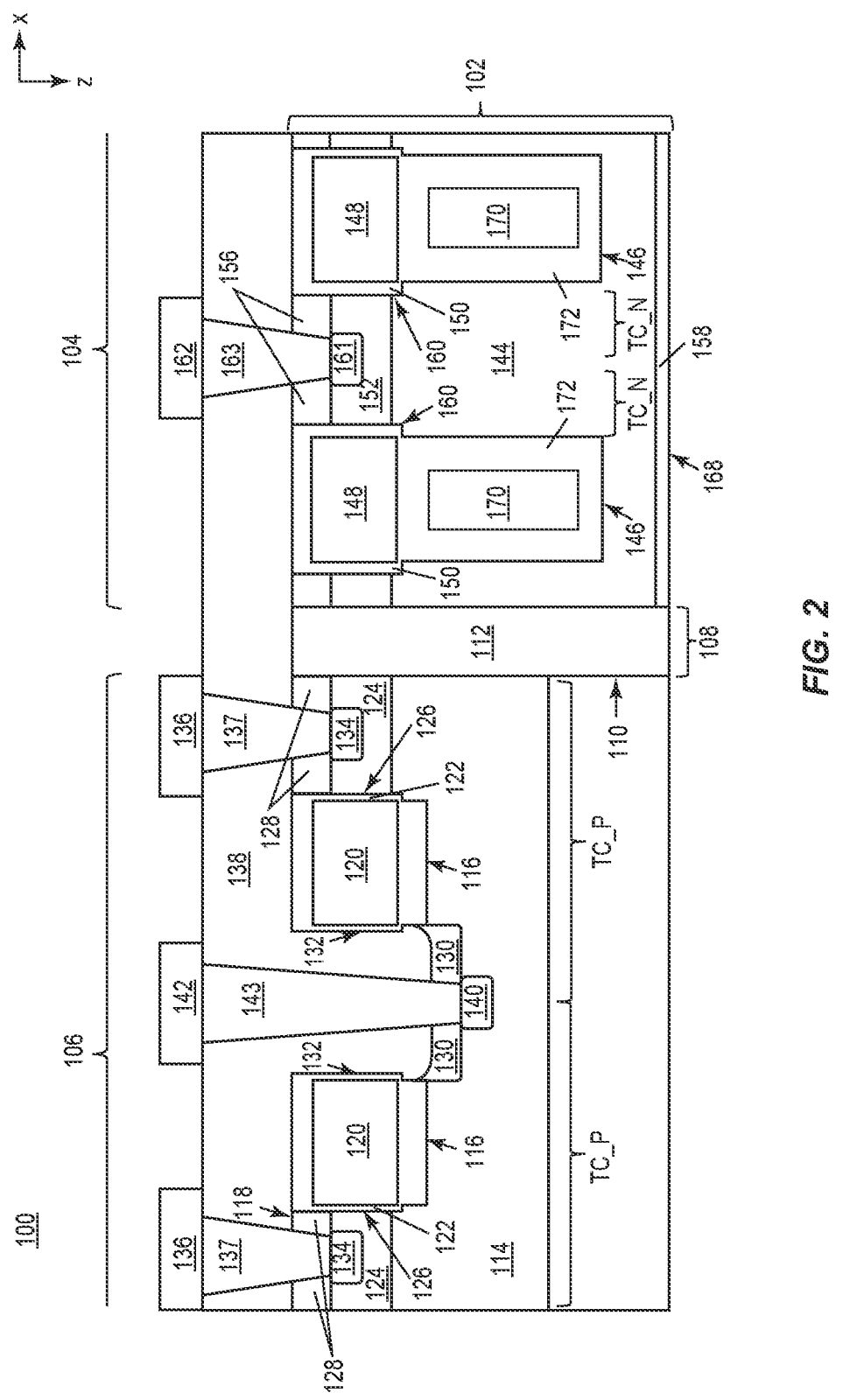
FIG. 2 illustrates a cross-sectional view of part of a semiconductor die that includes a trench gate NMOS transistor and a trench gate PMOS transistor monolithically integrated in the same die, according to another embodiment.

FIG. 2 illustrates a cross-sectional view of part of the semiconductor die 100, according to another embodiment. The embodiment shown in FIG. 2 is similar to the embodiment shown in FIG. 1. In FIG. 2, the illustrated trench gate NMOS transistor cells TC_N form part of a vertical NMOS-FET. According to this embodiment, the n-type drain region 158 of the vertical power NMOSFET is arranged at a second main surface 168 of the silicon substrate 102 opposite the first main surface 118. The vertical power NMOSFET also includes a field electrode 170 below the gate electrode 148 in each second stripe-shaped gate trench 146 and dielectrically insulated from the silicon substrate 102 by a field dielectric 172 in the first device region 104.

Figure 3:
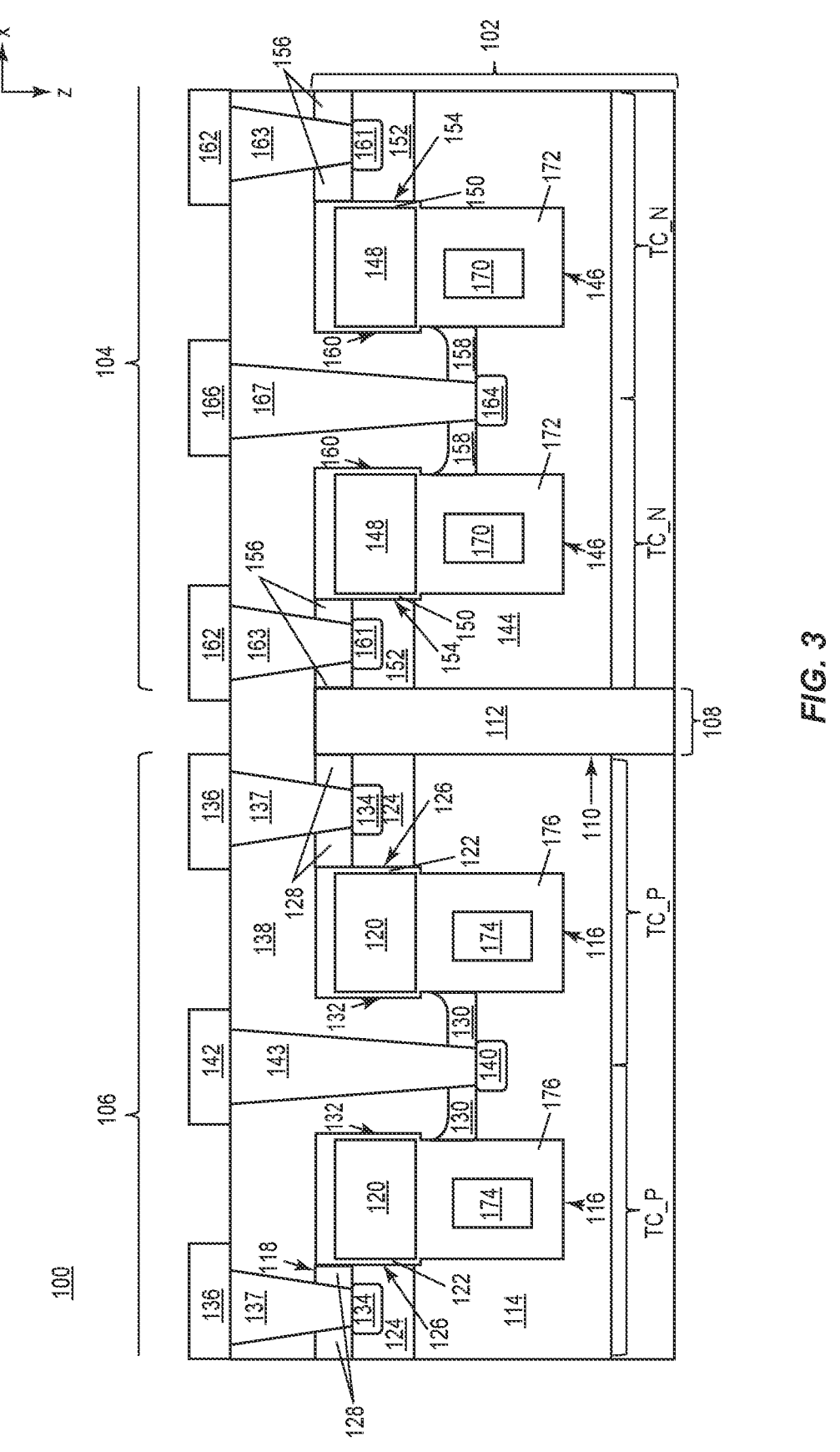
FIG. 3 illustrates a cross-sectional view of part of a semiconductor die that includes a trench gate NMOS transistor and a trench gate PMOS transistor monolithically integrated in the same die, according to another embodiment.

FIG. 3 illustrates a cross-sectional view of part of the semiconductor die 100, according to another embodiment. The embodiment shown in FIG. 3 is similar to the embodiment shown in FIG. 1. In FIG. 3, each first stripe-shaped gate trench 116 of the trench gate PMOS transistor includes a field electrode 174 below the corresponding gate electrode 120 and dielectrically insulated from the silicon substrate 102 by a field dielectric 176. Each second stripe-shaped gate trench 146 of the trench gate NMOS transistor also may include a field electrode 170 below the corresponding gate electrode 148 and dielectrically insulated from the silicon substrate 102 by a field dielectric 172. The field electrodes 170, 174 help to increase the breakdown voltage capability of the respective trench gate transistors formed in the first and second device regions 104, 106.

Figure 4:
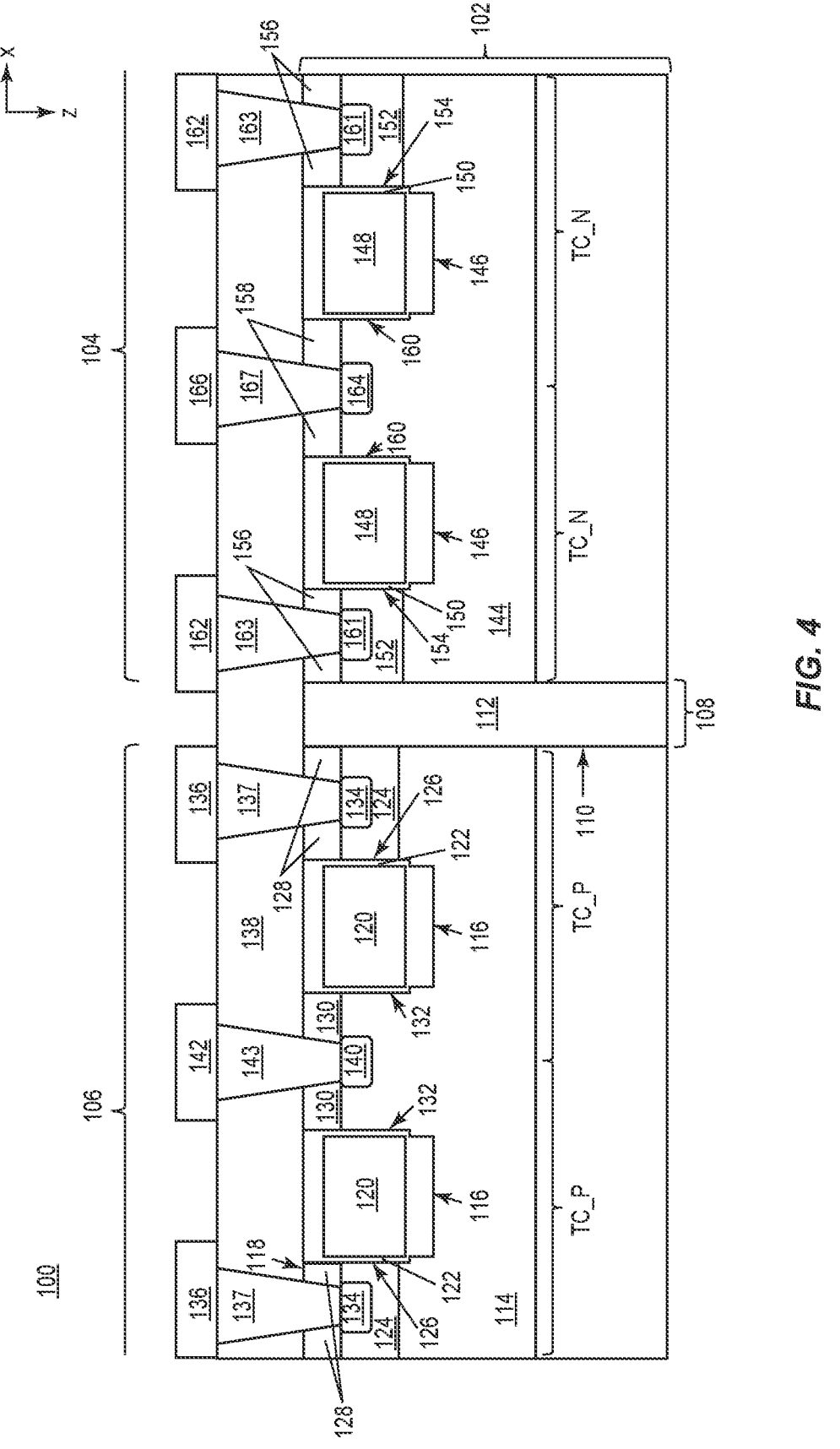
FIG. 4 illustrates a cross-sectional view of part of a semiconductor die that includes a trench gate NMOS transistor and a trench gate PMOS transistor monolithically integrated in the same die, according to another embodiment.

FIG. 4 illustrates a cross-sectional view of part of the semiconductor die 100, according to another embodiment. The embodiment shown in FIG. 4 is similar to the embodiment shown in FIG. 1. In FIG. 4, the first main surface 118 of the silicon substrate 102 is not recessed adjacent the second sidewall 132 of each first stripe-shaped gate trench 116 such that both the p-type source regions 128 and p-type drain regions 130 of the trench gate PMOS transistor are arranged at the first main surface 118 in the second device region 106. The first main surface 118 of the silicon substrate 102 also is not recessed adjacent the second sidewall 132 of each second stripe-shaped gate trench 146 of the trench gate NMOS transistor such that the n-type source regions 156 and n-type drain regions 158 are arranged at the first main surface 118 in the first device region 104.

Figure 5:
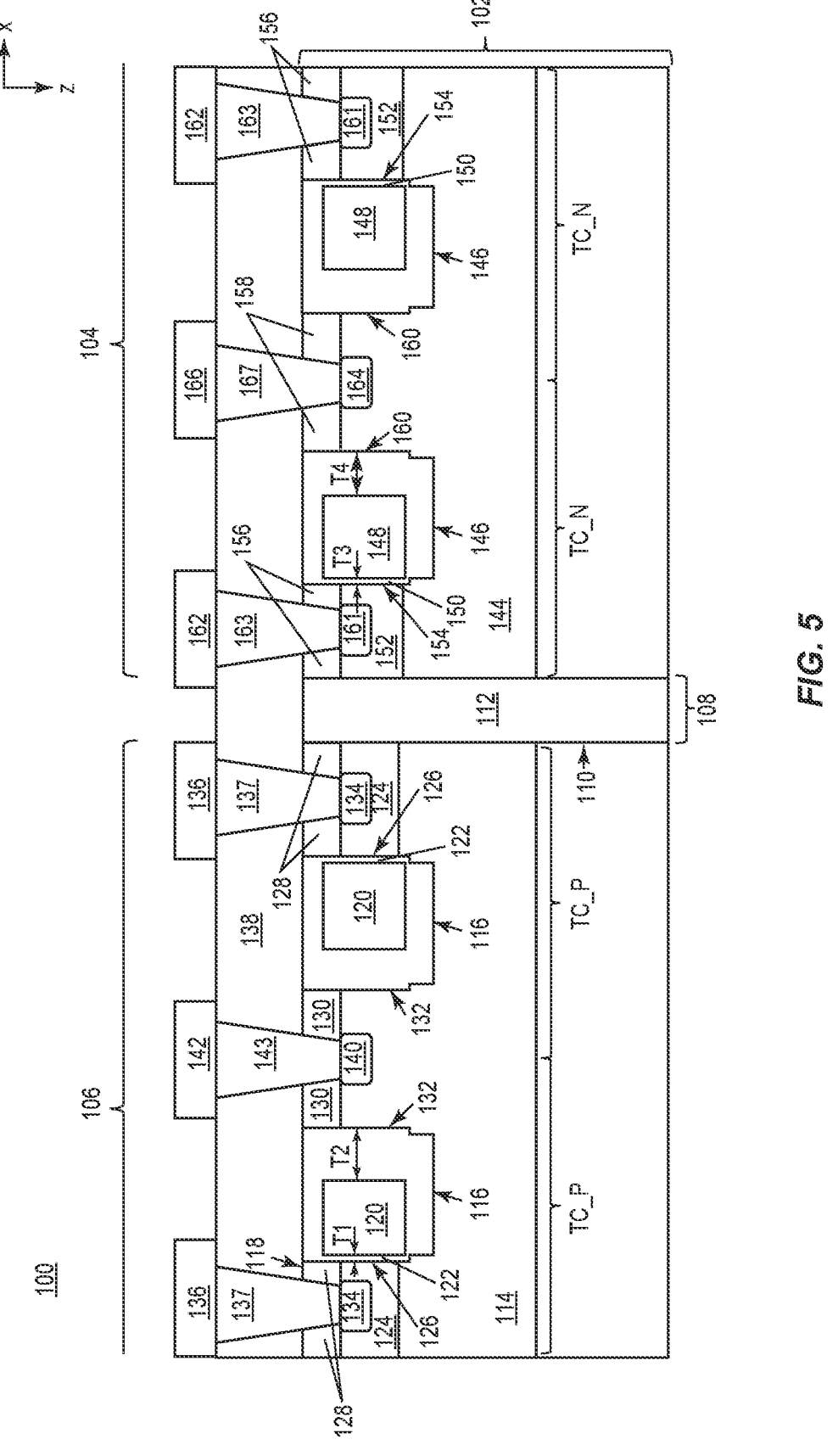
FIG. 5 illustrates a cross-sectional view of part of a semiconductor die that includes a trench gate NMOS transistor and a trench gate PMOS transistor monolithically integrated in the same die, according to another embodiment.

FIG. 5 illustrates a cross-sectional view of part of the semiconductor die 100, according to another embodiment. The embodiment shown in FIG. 5 is similar to the embodiment shown in FIG. 4. In FIG. 5, the gate dielectric 122 of the trench gate PMOS transistor is thicker (T2>T1) at the second (drain-side) sidewall 132 of each first stripe-shaped gate trench 116 than at the first (source-side) sidewall 126. According to this embodiment, for each first stripe-shaped gate trench 116 of the trench gate PMOS transistor, the gate electrode 120 laterally terminates closer to the first sidewall 126 than to the second sidewall 132 such that the gate electrode 120 is laterally separated from the p-type drain region 130 at the second sidewall 132 by a larger distance (T2) than from the p-type source region (T1) 128 at the first sidewall 126.

In one embodiment, the gate dielectric 122 of the trench gate PMOS transistor is made thicker at the second sidewall 132 of each first stripe-shaped gate trench 116 than at the first sidewall 126 by exposing part of the gate electrodes 120 in the first stripe-shaped gate trenches 116 such that a first part of the gate electrode 120 adjacent to the first sidewall 122 of each first stripe-shaped gate trench 116 is covered by the mask and a second part of the gate electrode 120 adjacent to the second sidewall 132 of each first stripe-shaped gate trench 116 is uncovered by the mask. The uncovered second part of the gate electrode 120 in each first stripe-shaped gate trench 116 is removed to form a cavity between the second sidewall 132 and the first part of the gate electrode 120 which remains in the first stripe-shaped gate trenches 116. The cavity in the first stripe-shaped gate trenches 116 is then filled with a dielectric material.

The gate dielectric 150 of the trench gate NMOS transistor also may be thicker (T3>T4) at the second (drain-side) sidewall 160 of each second stripe-shaped gate trench 146 than at the first (source-side) sidewall 154. Accordingly, for each second stripe-shaped gate trench 146 of the trench gate NMOS transistor, the gate electrode 148 laterally terminates closer to the first sidewall 154 than to the second sidewall 160 such that the gate electrode 148 is laterally separated from the p-type drain region 158 at the second sidewall 160 by a larger distance (T4) than from the p-type source region (T3) 156 at the first sidewall 154.

Figure 6:
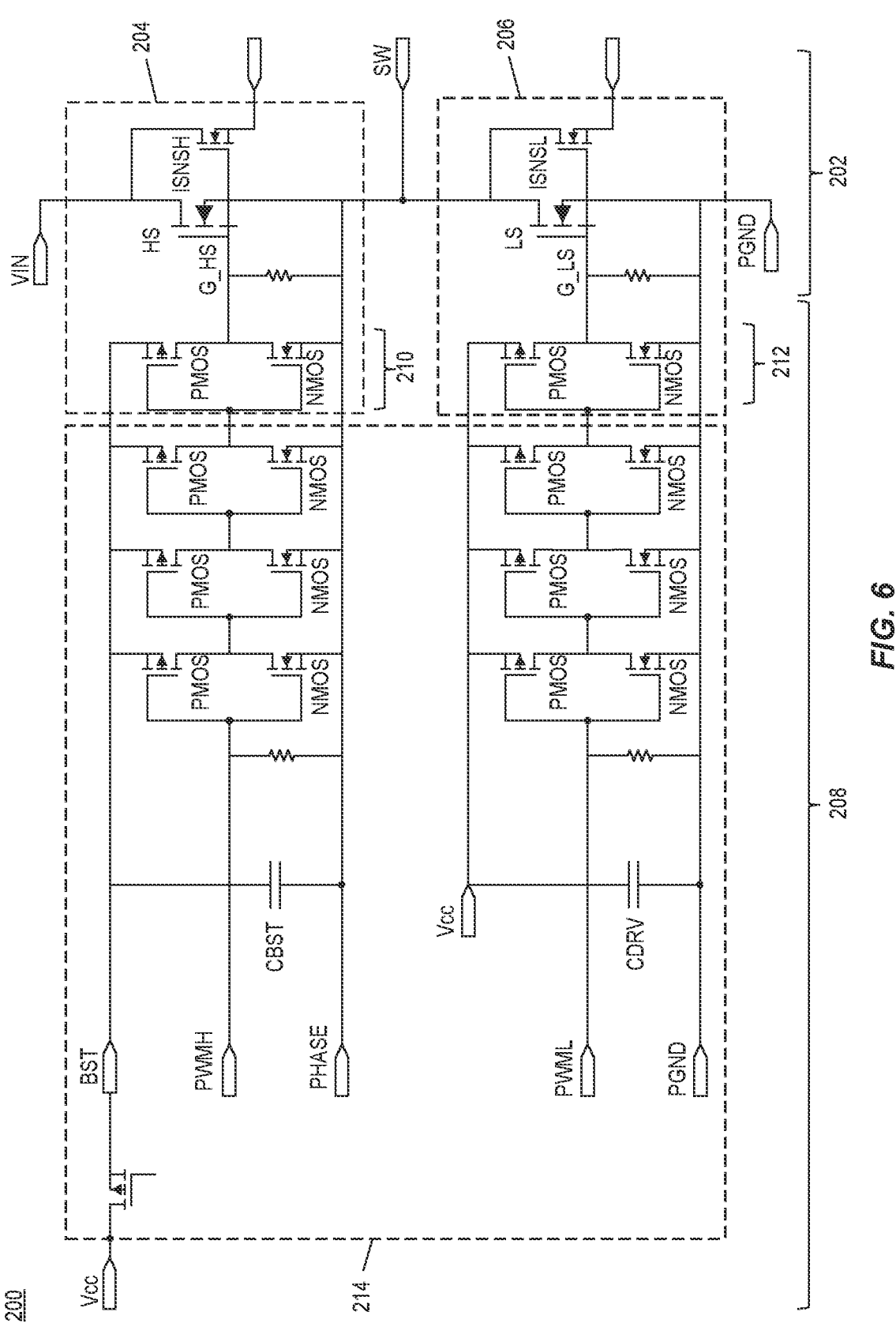
FIG. 6 illustrates a circuit schematic of a power converter circuit that can be implemented using the PMOS/NMOS monolithic integration techniques described herein.

FIG. 6 illustrates a circuit schematic of a power converter circuit 200 that can be implemented using the PMOS/NMOS monolithic integration techniques described herein. A half bridge 202 is formed by a high-side power NMOSFET 'HS' and a low-side power NMOSFET 'LS' coupled in series between a voltage node 'VIN' and ground 'PGND'. The half bridge output is labelled 'SW' in FIG. 6. A current sense transistor 'ISNSH', 'ISNSL' may be provided for each power NMOSFET HS, LS.

Each power NMOSFET HS, LS and the corresponding current sense transistor ISNSH, ISNSL may be provided in separate Si dies 204, 206. Part of a gate driver 208 for the power NMOSFETs HS, LS may be monolithically integrated in each power NMOSFET die 204, 206. For example, at least the last gate driver stage 210 for the high-side power NMOSFET HS may be monolithically integrated in the high-side power transistor die 204 and at least the last gate driver stage 212 for the low-side power NMOSFET LS may be monolithically integrated in the low-side power transistor die 206. Any remaining driver stages may be provided in a third Si die 214.

Each stage of the gate driver 208 may include a high-side PMOS transistor connected in series with a low-side NMOS transistor. The high-side PMOS transistor and the low-side NMOS transistor of at least the last driver stage 210, 212 for the corresponding power NMOSFET HS, LS may be monolithically integrated in the respective power transistor dies 204, 206, e.g., in accordance with any of the monolithic integration embodiments shown in any of FIGS. 1 through 5, where each PMOS driver stage transistor integrated in a power transistor die 204, 206 is implemented in the second device region 106 and each NMOS driver stage transistor integrated in a power transistor die 204, 206 is implemented in the first device region 104. The respective power NMOSFETs HS, LS are also implemented in the first device region 104 of the corresponding power transistor die 204, 206, e.g., in accordance with any of the monolithic integration embodiments shown in FIGS. 1 through 5.

FIG. 6 shows the last driver stage 210 for the high-side power NMOSFET HS monolithically integrated in the high-side power transistor die 204 and the last driver stage 212 for the low-side power NMOSFET LS monolithically integrated in the low-side power transistor die 206. However, this is just an example. One or more additional stages of the gate driver 208 may be monolithically integrated in the corresponding power transistor die 204, 206, including up to and including all stages of the gate driver 208 such that the third die 204 is eliminated.

In one embodiment, the trench gate NMOS transistor shown in any of FIGS. 1 through 5 is the high-side power NMOSFET HS or the low-side power NMOSFET LS of the power converter half bridge 202 and the trench gate PMOS transistor shown in any of FIGS. 1 through 5 forms part of the driver stage 210/212 for the trench gate NMOS transistor. In another embodiment, the trench gate PMOS transistor and the trench gate NMOS transistor shown in any of FIGS.

1 through 5 form complimentary parts of at least the last stage 210, 212 of the gate driver 208 for the high-side power NMOSFET HS and the low-side power NMOSFET LS of the power converter half bridge 202 and at least one additional stage of the gate driver 208 is integrated in a separate die 214.

In one embodiment, the p-type drain region 130 arranged at the second sidewall 132 of each first stripe-shaped gate trench 116 of the trench gate PMOS transistor shown in any of FIGS. 1 through 5 is electrically connected to the gate terminal 'G_HS', 'G_LS' of the corresponding power NMOSFET HS, LS of the power converter half bridge 202. For example, in any of FIGS. 1 through 5, the p-type drain regions 130 of the trench gate PMOS transistor may be electrically connected to the gate electrodes 148 in the second stripe-shaped gate trenches 146 of the trench gate NMOS transistor.

The p-type source region 128 arranged at the first sidewall 126 of each first stripe-shaped gate trench 116 of the trench gate PMOS transistor shown in any of FIGS. 1 through 5 may be electrically connected to a positive DC voltage input terminal 'BST' of the gate driver 108 and at which the input voltage 'Vcc' for the gate driver 208 is received. A first control signal input terminal 'PWMH' receives a controller signal for the driver stages of the high-side power NMOS-FET HS, and which is coupled to a phase reference terminal 'PHASE' via a boost capacitor 'CBST'. A second control signal input terminal 'PWML' receives a controller signal for the driver stages of the low-side power NMOSFET LS and is referenced to a ground terminal 'PGND' via a capacitor 'CDRV'. Other power converter circuit configurations may be realized by utilizing the monolithically integrated trench gate NMOS transistor and trench gate PMOS transistor embodiments described herein.

Figure 7A:
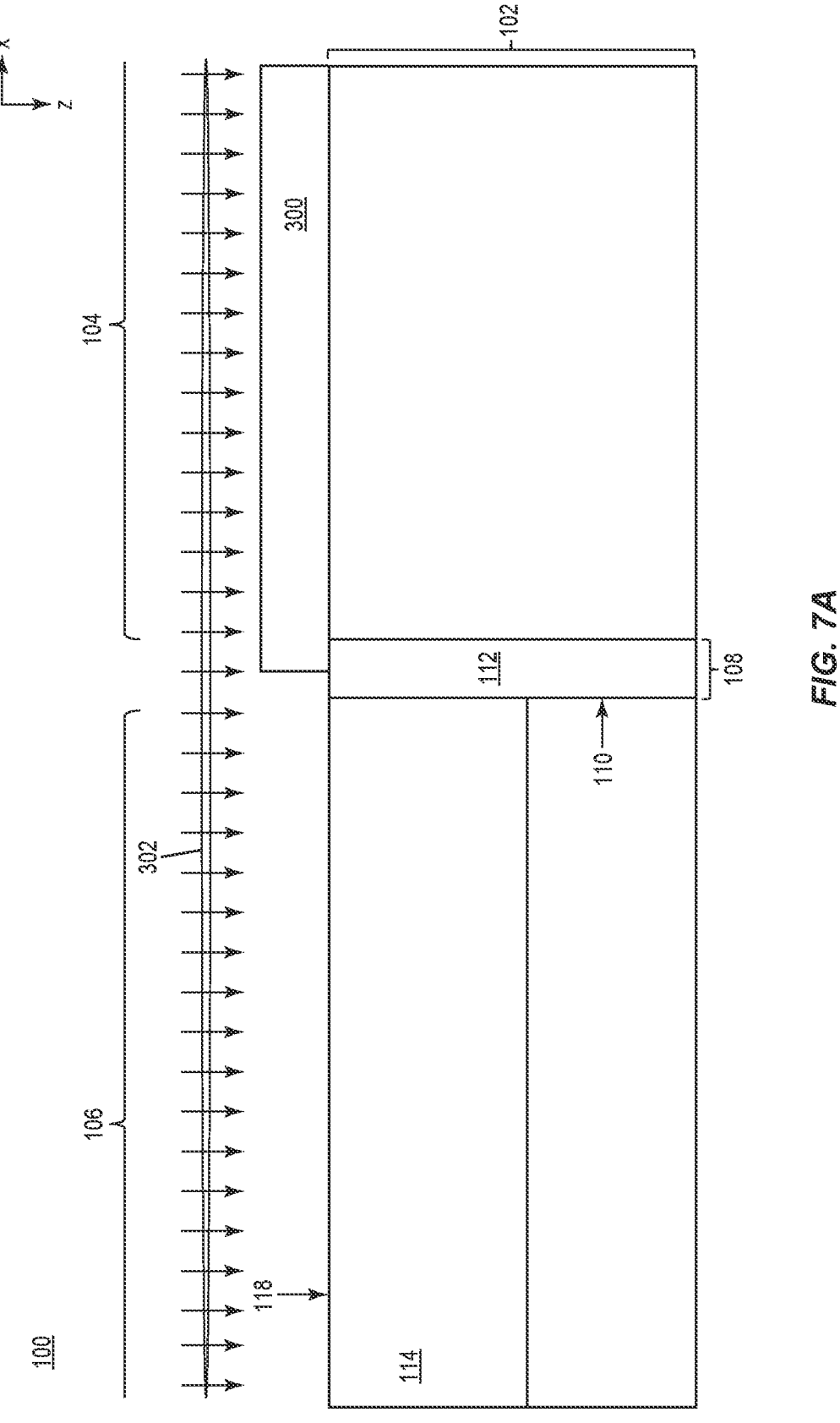
FIGS. 7A through 7N illustrate an embodiment of monolithically integrating a trench gate NMOS transistor and a trench gate PMOS transistor in the same semiconductor die.
Figure 7B:
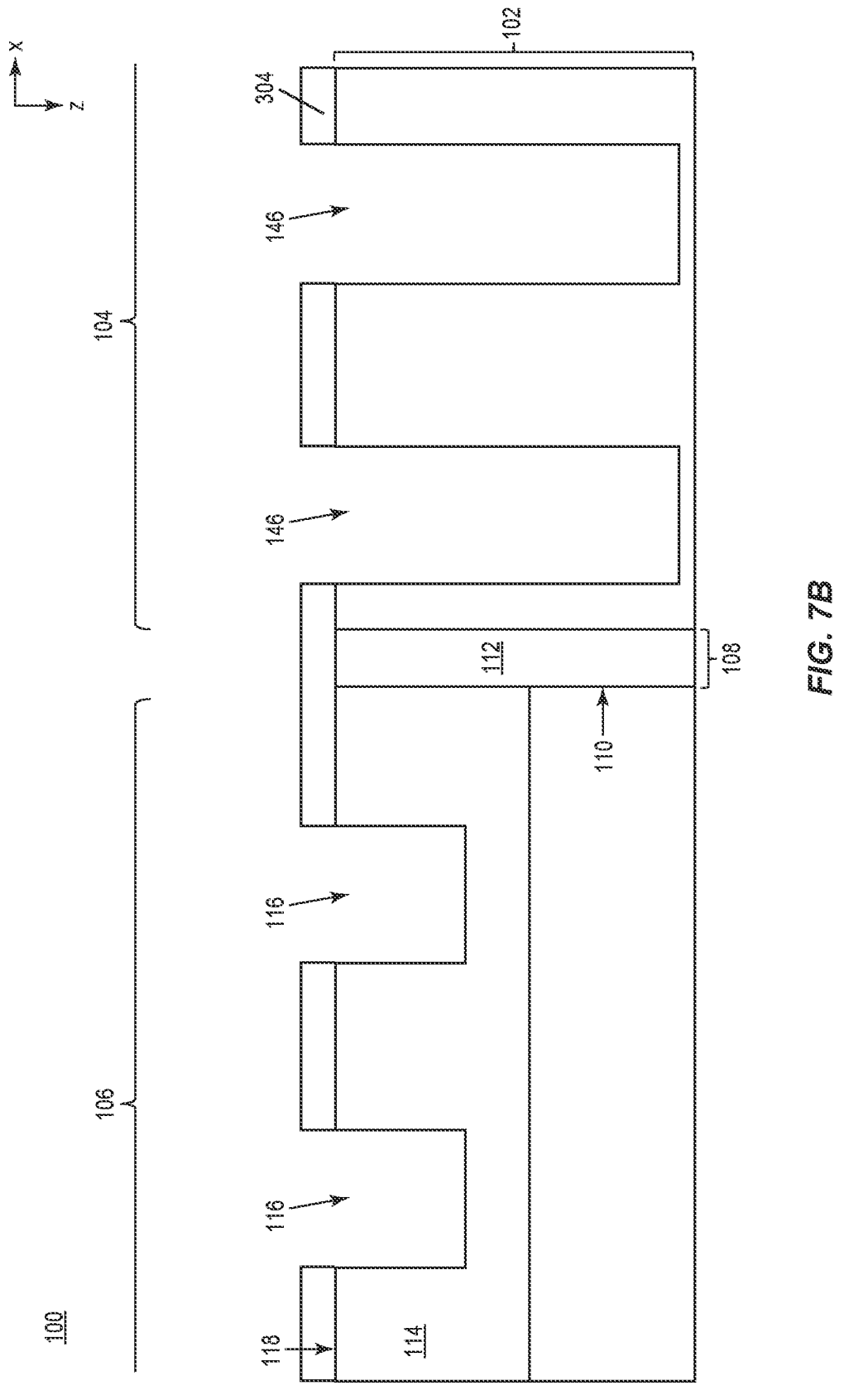
Figure 7C:
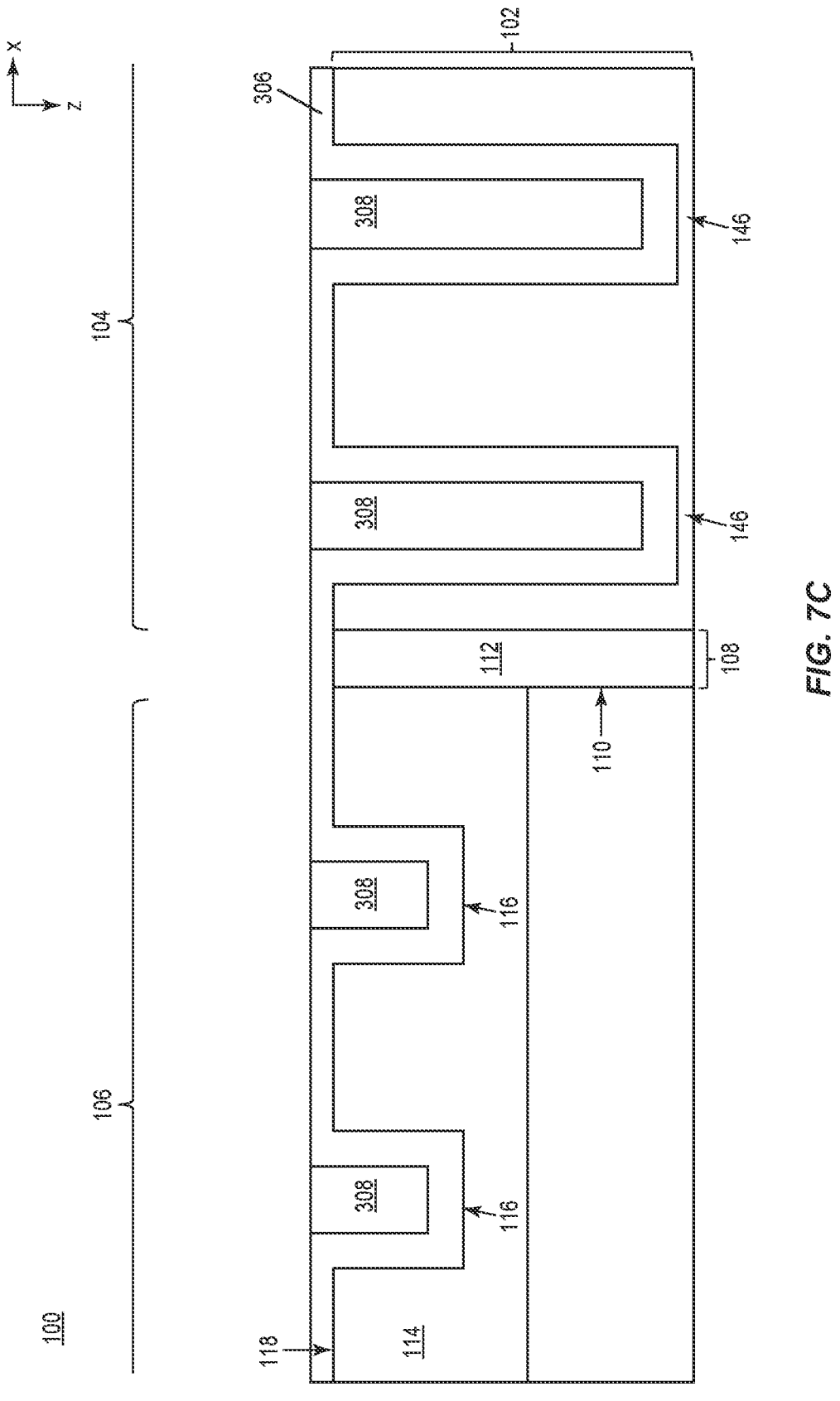
Figure 7D:
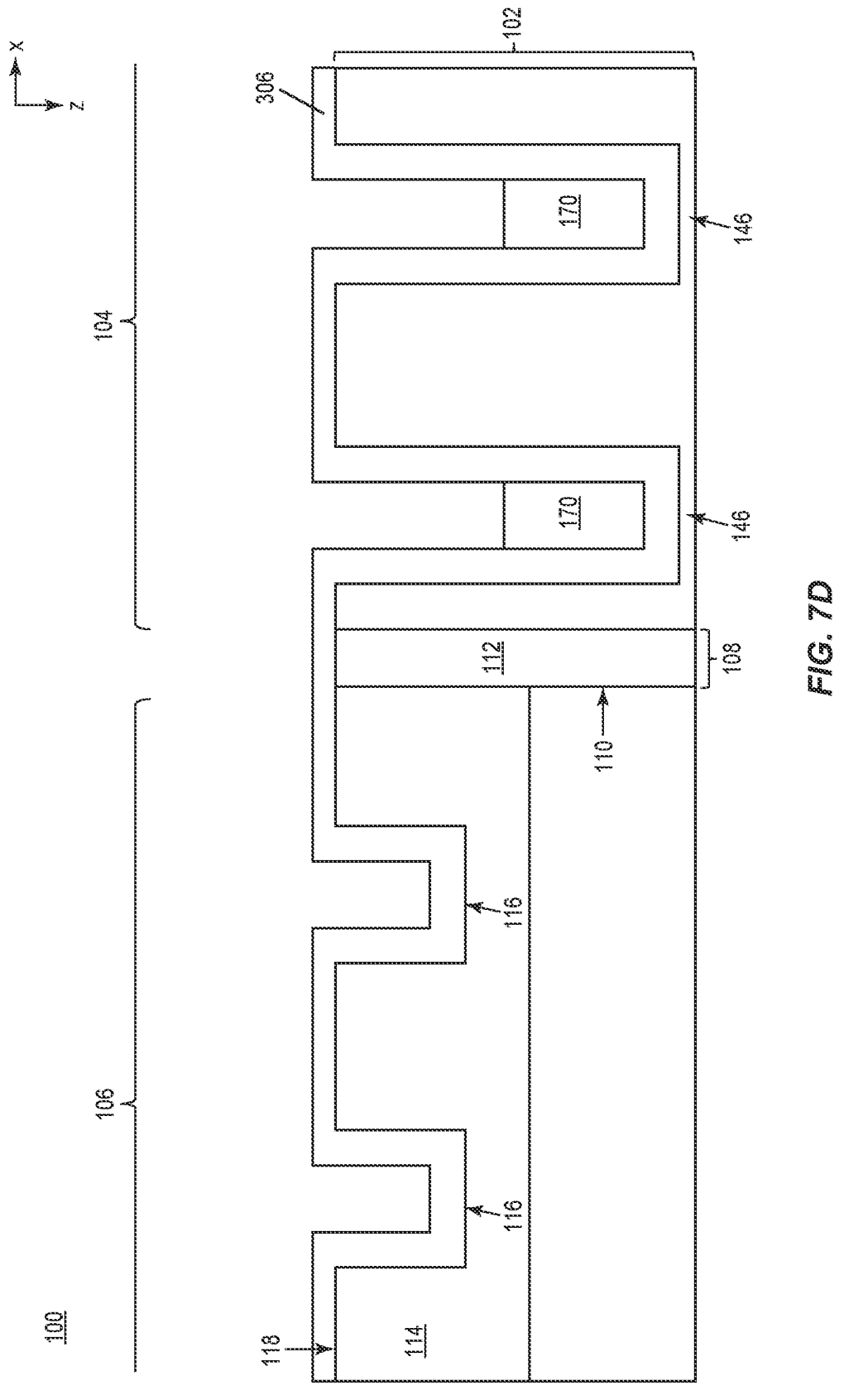
Figure 7E:
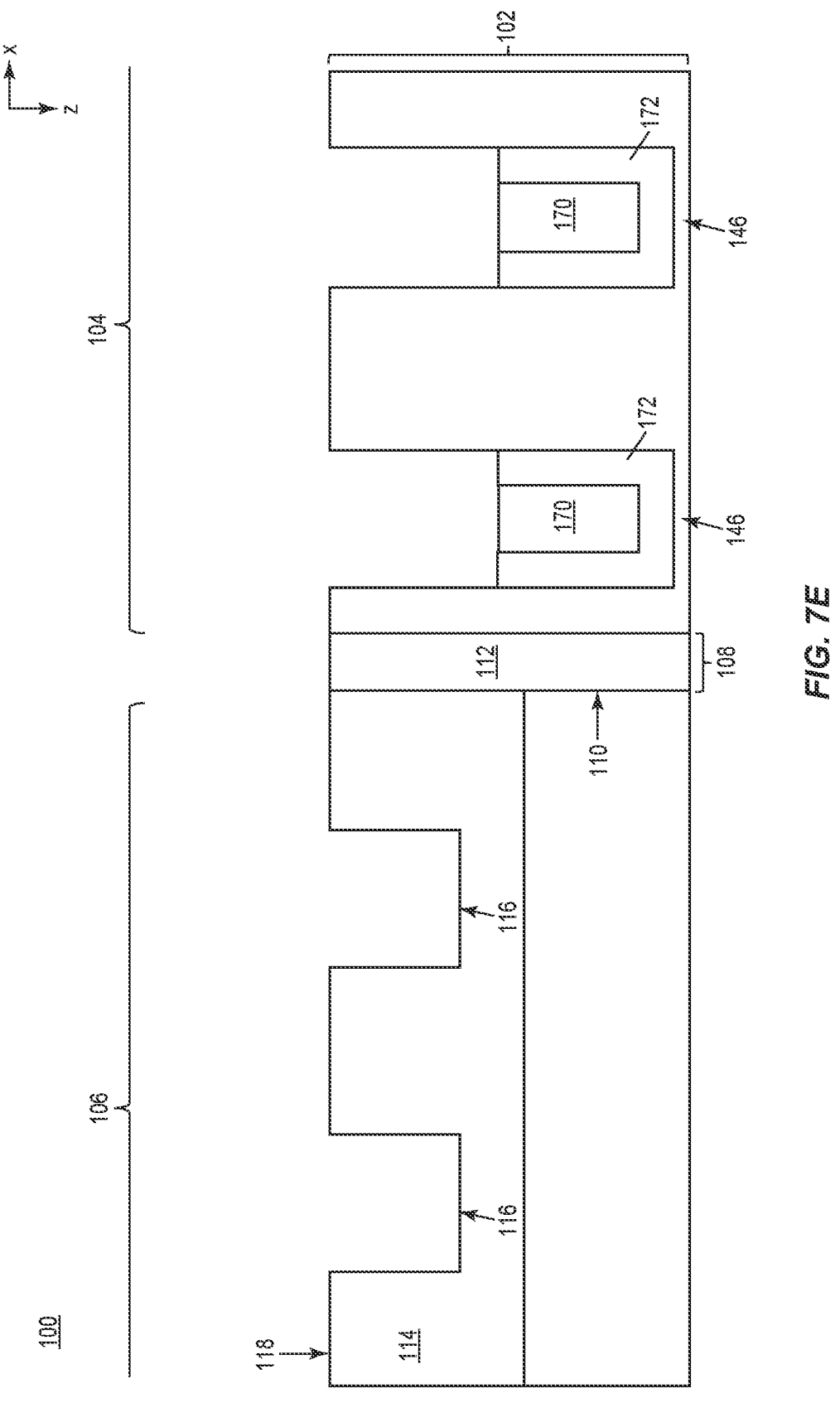
Figure 7F:
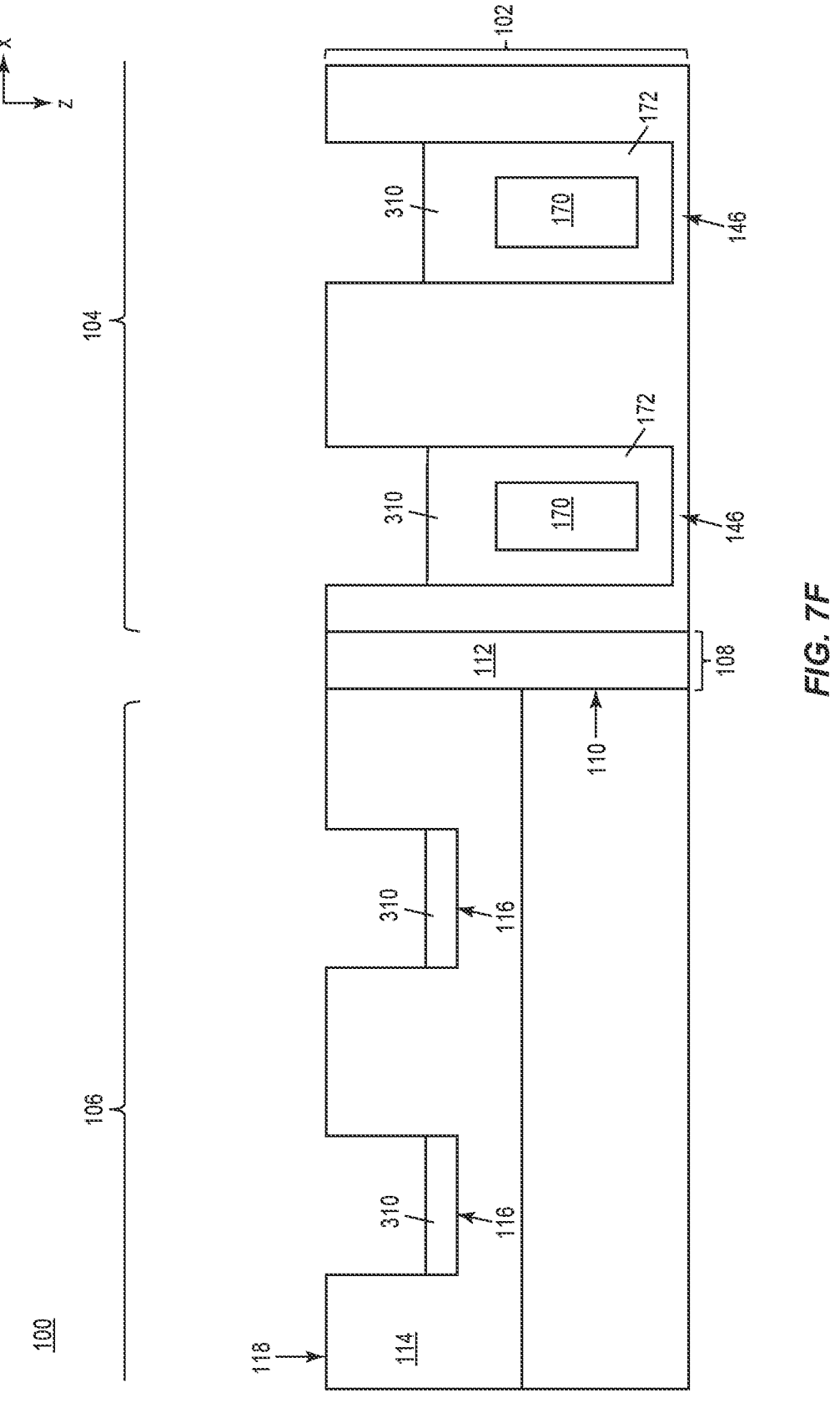
Figure 7G:
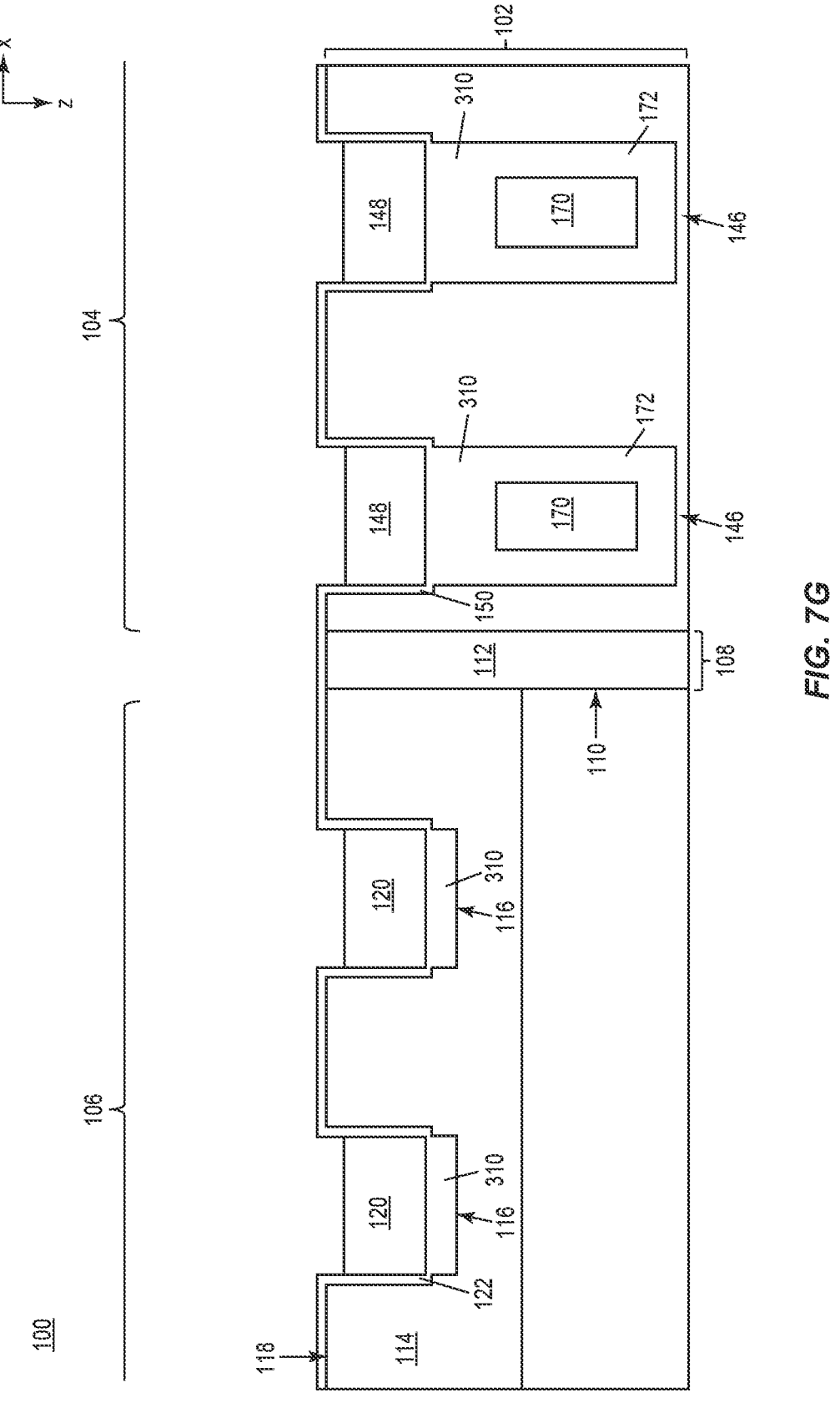
Figure 7H:
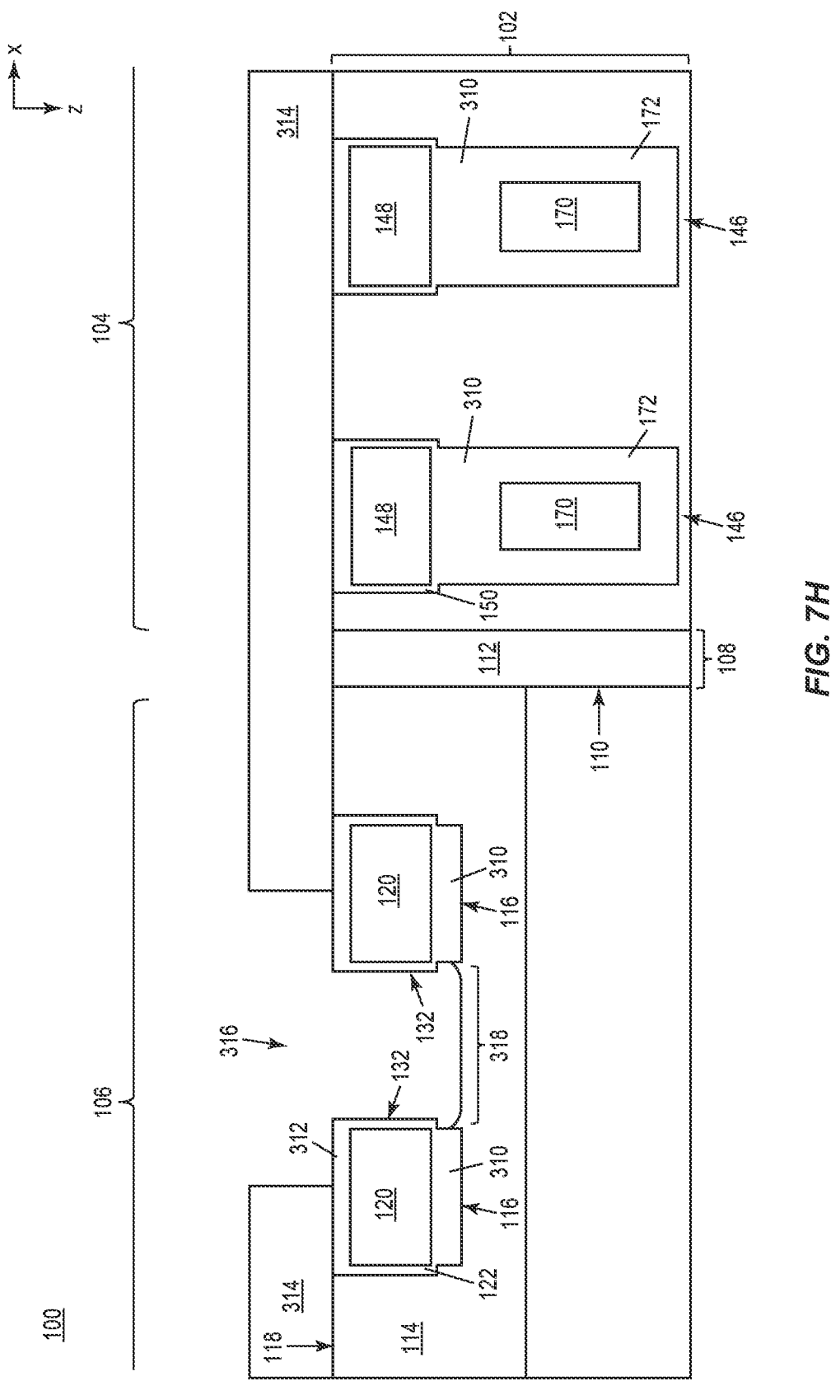
Figure 7I:
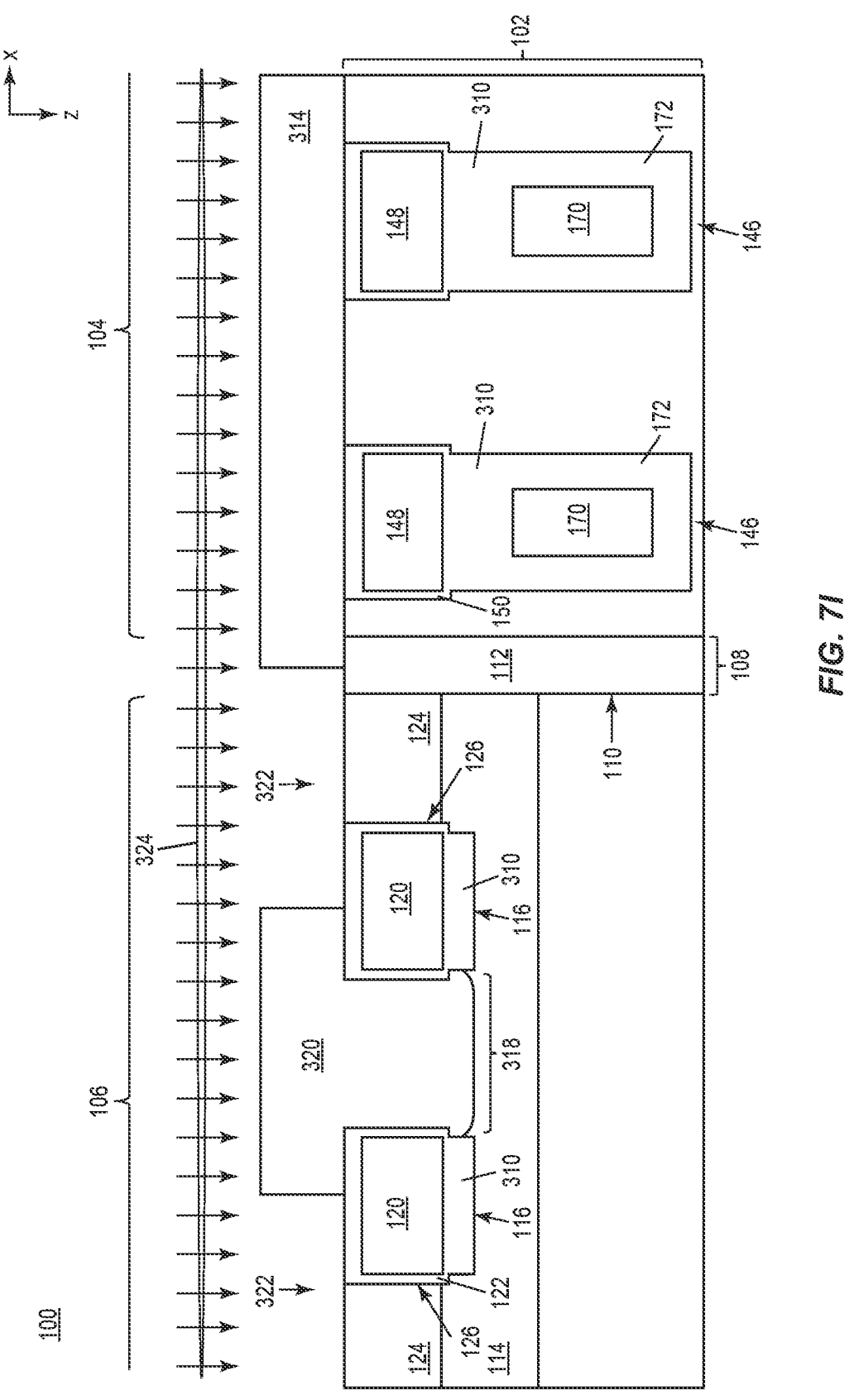
Figure 7J:
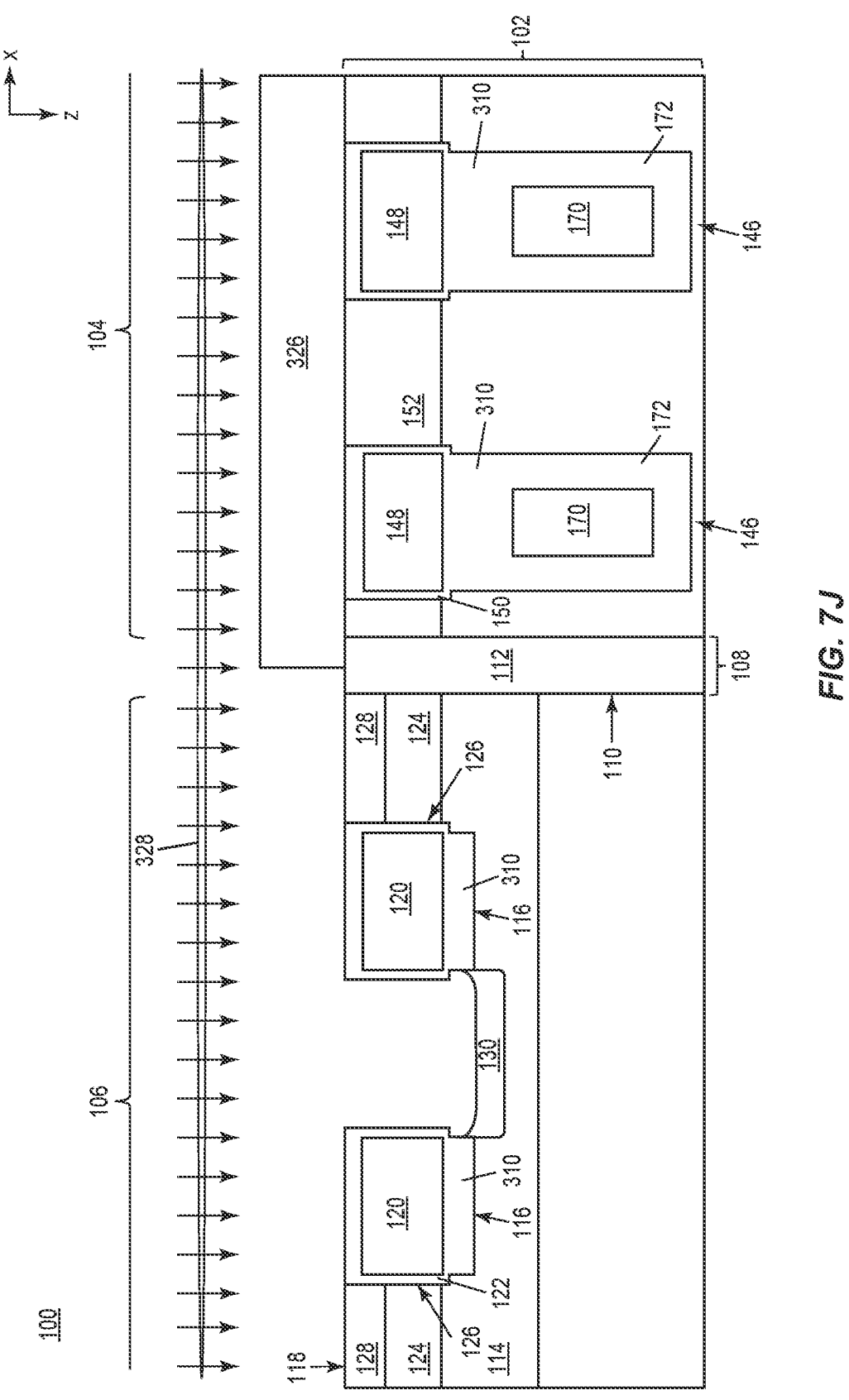
Figure 7K:
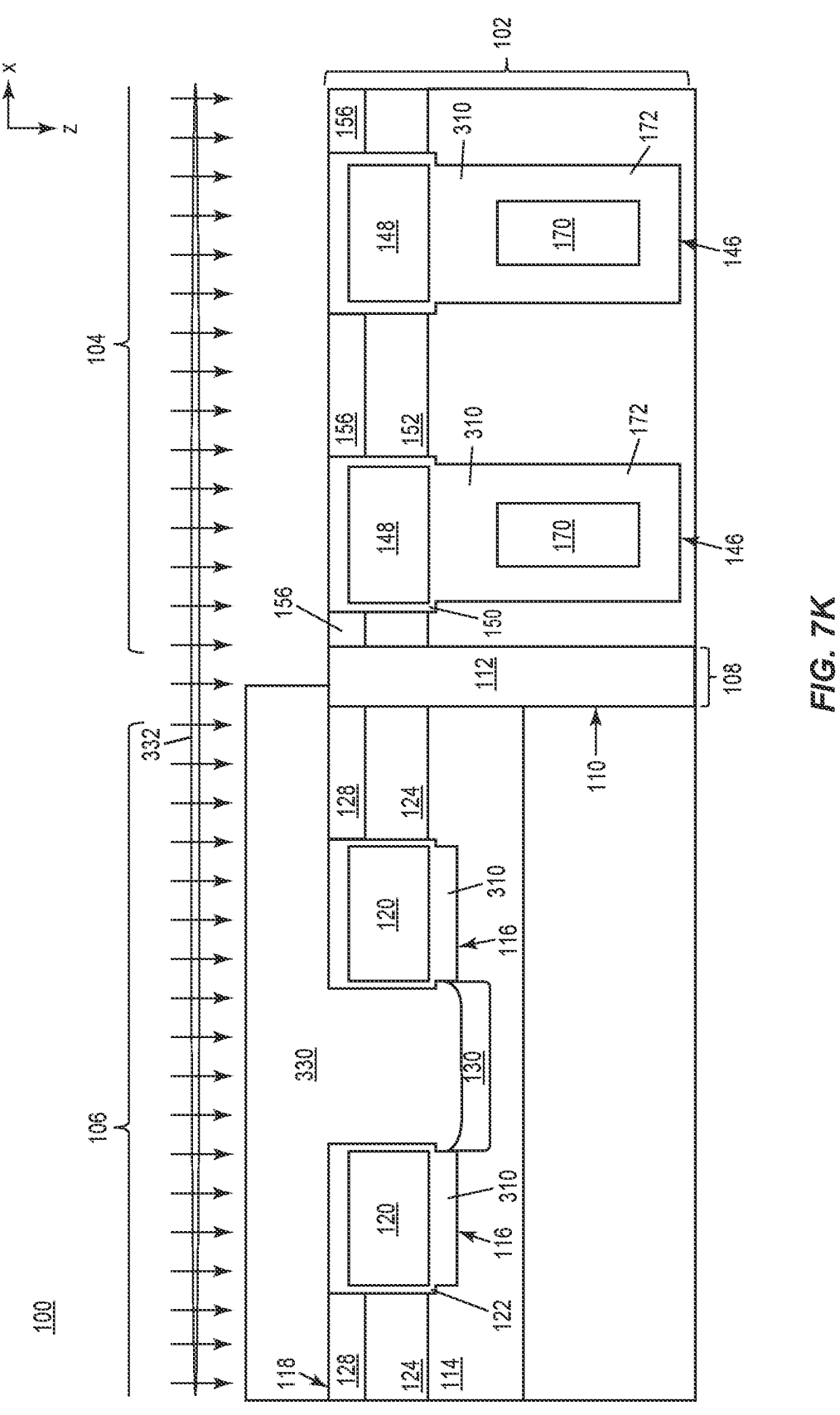
Figure 7L:
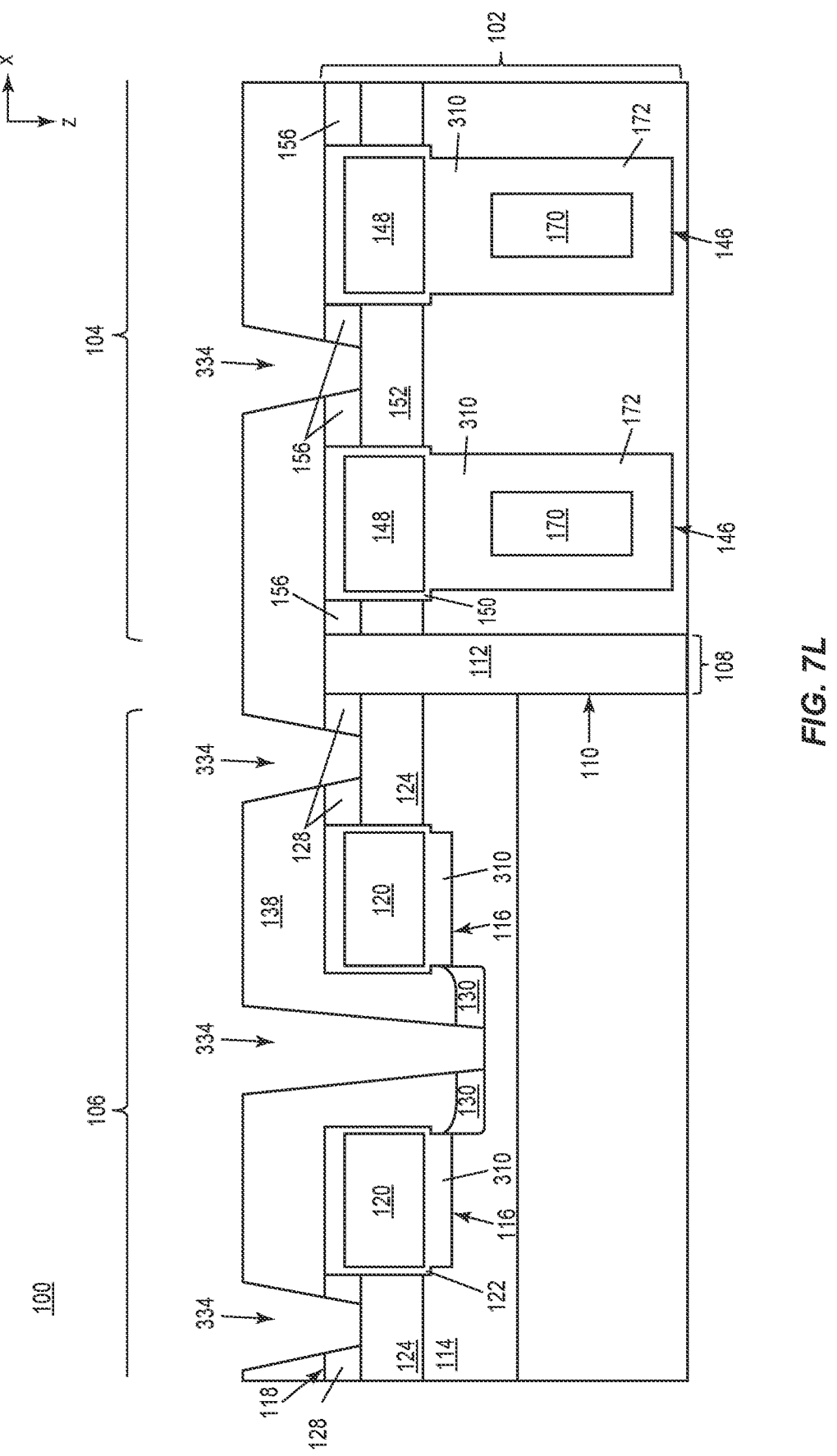
Figure 7M:
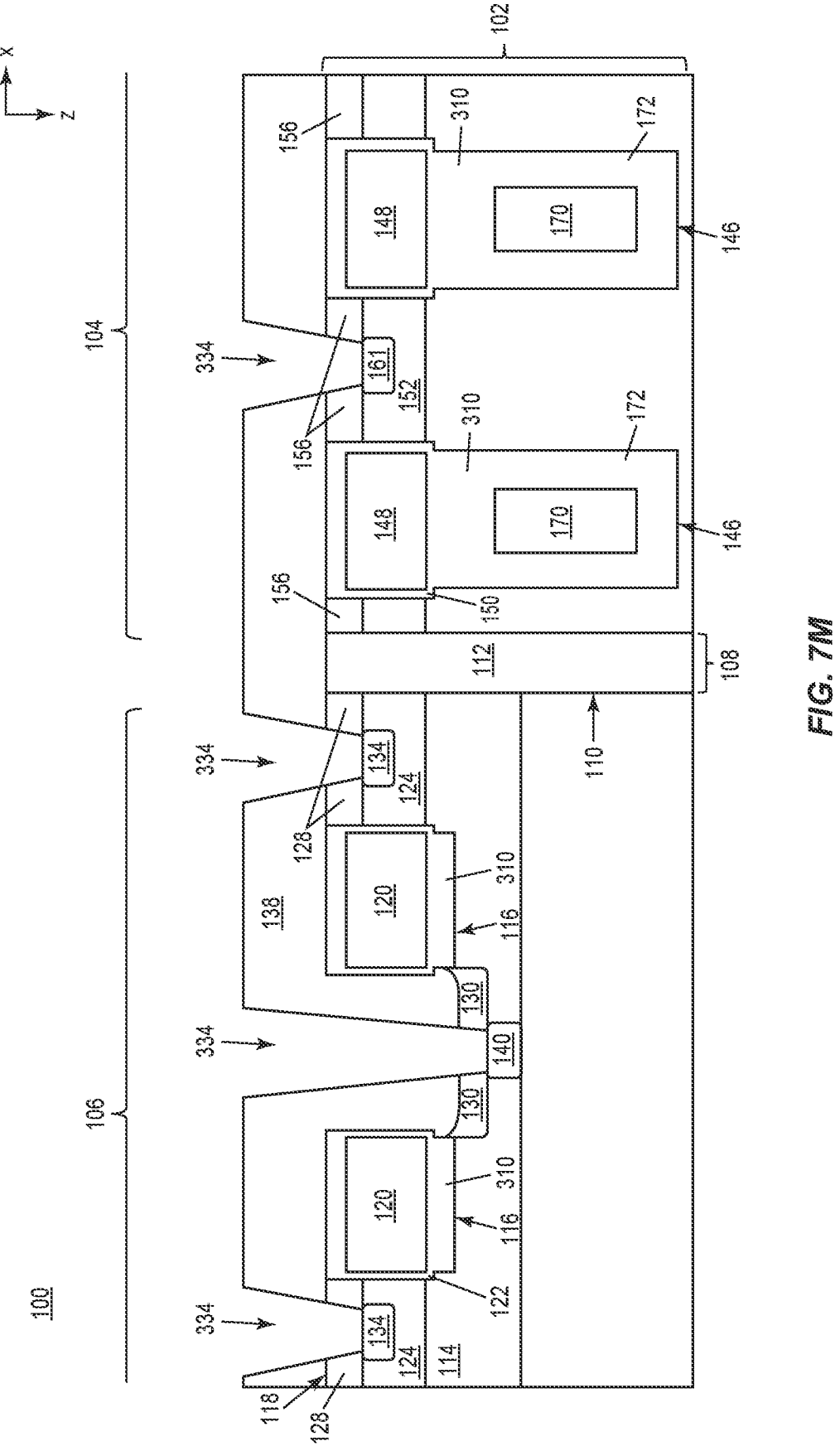
Figure 7N:
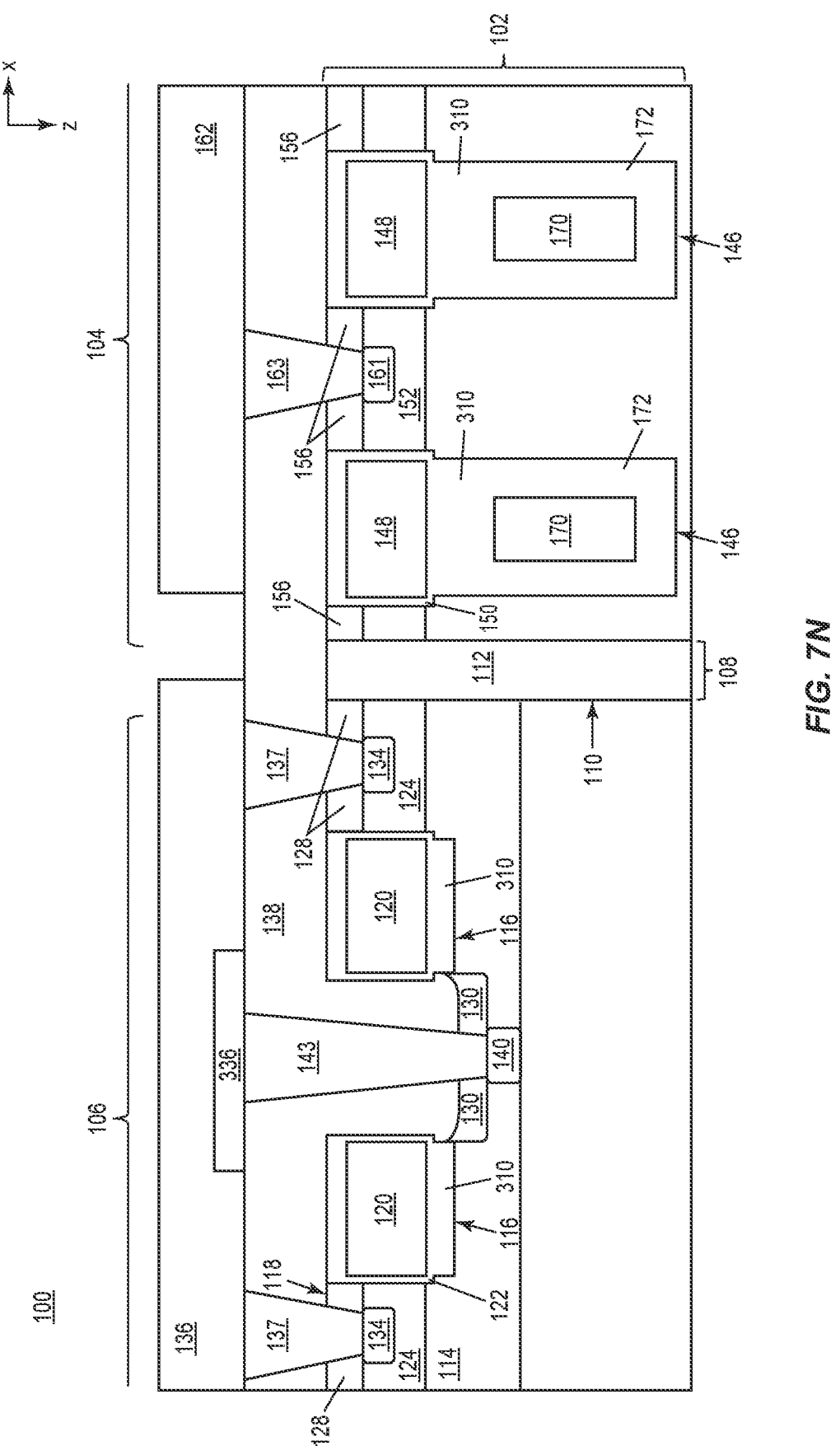

FIGS. 7A through 7N illustrate an embodiment of monolithically integrating the trench gate NMOS transistor and the trench gate PMOS transistor in the same semiconductor die 100. FIGS. 7A through 7N illustrate cross-sectional views of the same part of the semiconductor die 100 shown in FIGS. 1 through 5, at different stages of production.

FIG. 7A shows the semiconductor die 100 after formation of the isolation structure 108 which separates the first device region 104 and the second device region 106 from one another within the silicon substrate 102. The isolation structure 108 may be formed by etching a trench 110 into the first main surface 118 of the silicon substrate 102 and filling the trench 110 filled with an electrically insulative material 112 such as an oxide.

FIG. 7A also shows a photoresist 300 formed on the first main surface 118 of the silicon substrate 102 and covering the first device region 104 of the semiconductor die 100 but not the second device region 106. The photoresist 300 prevents a blanket implantation of a p-type dopant species 302 (e.g., boron and/or gallium for doping Si) from entering the silicon substrate 102 from the first main surface 118 in the first device region 104, during formation of the p-type drift region 114 in the second device region 106.

FIG. 7B the semiconductor die 100 after the stripe-shaped gate trenches 116, 146 are etched into the first main surface 118 of the silicon substrate 102 in the first and second device regions 104, 106 using a hard mask such as an oxide layer formed on the first main surface 118. The stripe-shaped gate trenches 146 in the first device region 104 may extend to the same depth in the silicon substrate 102 as the stripe-shaped gate trenches 116 in the second device region 106 or may extend deeper into the silicon substrate 102 as shown in FIG. 7B, depending on the cell layout of the trench gate NMOS transistor. For example, in FIGS. 1, 3, 4 and 5, the stripe-shaped gate trenches 146 in the first device region 104 extend to the same depth in the silicon substrate 102 as the stripe-shaped gate trenches 116 in the second device region 106. In FIG. 2, the stripe-shaped gate trenches 146 in the first device region 104 extend deeper into the silicon substrate 102 than the stripe-shaped gate trenches 116 in the second device region 106. More than one hard mask may be used to form the stripe-shaped gate trenches 116, 146, if the trench depth is deeper in the first device region 104 than in the second device region 106.

FIG. 7C shows the semiconductor die 100 after removal of the hard mask(s) 304, formation of a field oxide layer 306 along the bottom and sidewalls of the stripe-shaped gate trenches 116, 146, deposition of a first electrode material 308 such as polysilicon after field oxide formation, and after planarization of the first electrode material 308, e.g., by CMP (chemical-mechanical polishing).

FIG. 7D shows the semiconductor die 100 after a recess etch of the first electrode material 308. The first electrode material 308 is completely removed from the stripe-shaped gate trenches 116 in the second device region 106, since the stripe-shaped gate trenches 116 in the second device region 106 are shallower than the stripe-shaped gate trenches 146 in the first device region 104 in this example. The recessed part of the first electrode material 308 that remains in the stripe-shaped gate trenches 146 in the first device region 104 forms the field electrodes 170 shown in FIG. 2.

FIG. 7E shows the semiconductor die 100 after removal of the field oxide layer 306 from the stripe-shaped gate trenches 116 in the second device region 106 and from the upper part of the stripe-shaped gate trenches 146 in the first device region 104. The part of the field oxide layer 306 that remains in the lower part of the stripe-shaped gate trenches 146 in the first device region 104 forms the field dielectric 172 shown in FIG. 2.

FIG. 7F shows the semiconductor die 100 after an oxide spacer 310 is formed on the field electrodes 170 in the stripe-shaped gate trenches 146 in the first device region 104 and at the bottom of the stripe-shaped gate trenches 116 in the second device region 106. The oxide spacer 310 may be formed by high-density-plasma chemical vapor deposition (HDP-CVD) which is planarized (e.g., CMP) at the first main surface 118 of the silicon substrate 102 and then recessed into the stripe-shaped gate trenches 116, 146, for example.

FIG. 7G shows the semiconductor die 100 after forming the gate dielectric 122 in the stripe-shaped gate trenches 116 in the second device region 106 and the gate dielectric 150 in the stripe-shaped gate trenches 146 in the first device region 104, and then forming the respective gate electrodes 120, 148 on the gate dielectrics 122, 150. The gate dielectric 150 in the stripe-shaped gate trenches 146 in the first device region 104 may have a different thickness than the gate dielectric 122 in the stripe-shaped gate trenches 116 in the second device region 106, e.g., using photolithography.

FIG. 7H shows the semiconductor die 100 after recess etching of the Si mesas between adjacent stripe-shaped gate trenches 116 in the second device region 106, to eventually form recessed p-type drain regions 130 in the second device region 106 as shown in FIGS. 1, 2 and 3. In one embodiment, an oxide layer is deposited over the first main surface 118 of the silicon substrate 102 and planarized (e.g., CMP) such that any remaining space in the stripe-shaped gate trenches 116, 146 in both device regions 104, 106 is filled with a planarized oxide 312. A patterned mask 314 such as a photoresist is then formed on the first main surface 118 of the silicon substrate 102, with an opening 316 that exposes the Si mesas between adjacent stripe-shaped gate trenches 116 in the second device region 106. The exposed Si mesas between adjacent stripe-shaped gate trenches 116 in the second device region 106 are then isotropically etched to a depth in the silicon substrate 102 such that the silicon substrate 102 has a recessed part 318 between the second sidewall 132 of adjacent ones of the stripe-shaped gate trenches 116 in the second device region 106.

FIG. 7I shows the semiconductor die 100 after the n-type body regions 124 of the trench gate PMOS transistor are formed in the second device region 106. In one embodiment, a patterned mask 320 such as a photoresist is formed on the first main surface 118 of the silicon substrate 102, with an opening 322 that exposes the Si mesas 324 adjacent the first sidewall 126 of the stripe-shaped gate trenches 116 in the second device region 106. The patterned mask 320 prevents a blanket implantation of an n-type dopant species 324 (e.g., arsenic and/or phosphorous for doping Si) from entering the silicon substrate 102 from the first main surface 118 in the first device region 104 and from entering the recessed part 318 of the silicon substrate 102 between the second sidewall 132 of adjacent ones of the stripe-shaped gate trenches 116 in the second device region 106, during formation of the n-type body regions 124 of the trench gate PMOS transistor in the second device region 106. The patterned mask 320 is then removed and an optional RTA (rapid thermal anneal) drive-in may be performed.

FIG. 7J shows the semiconductor die 100 after the p-type source regions 128 and p-type drain regions 130 of the trench gate PMOS transistor are formed in the second device region 106. In one embodiment, a mask 326 such as a photoresist is formed on the first main surface 118 of the silicon substrate 102 and covers the first device region 104 of the semiconductor die 100 but not the second device region 106. A blanket implantation of a p-type dopant species 328 (e.g., boron and/or gallium for doping Si) into the first main surface 118 of the silicon substrate 102 in the second device region 106 forms the p-type source regions 128 and p-type drain regions 130 of the trench gate PMOS transistor. The thickness and/or composition of the mask 326 may be chosen so that a lighter dose of the p-type dopant species 328 enters the first main surface 118 of the silicon substrate 102 in the first device region 104, to form the p-type body regions 152 of the trench gate NMOS transistor. Alternatively, the p-type body regions 152 of the trench gate NMOS transistor may be formed via a different implantation process. In either case, the patterned mask 326 is removed after the implantation process 328.

FIG. 7K shows the semiconductor die 100 after the n-type source regions 156 of the trench gate NMOS transistor are formed in the first device region 104. In one embodiment, a mask 330 such as a photoresist is formed on the first main surface 118 of the silicon substrate 102 and covers the second device region 106 of the semiconductor die 100 but not the first device region 104. The mask 330 prevents a blanket implantation of an n-type dopant species 332 (e.g., arsenic and/or phosphorous for doping Si) from entering the silicon substrate 102 from the first main surface 118 in the second device region 106, during formation of the n-type source regions 156 of the trench gate NMOS transistor in the first device region 104. The patterned mask 330 is removed after the implantation process 332.

FIG. 7L shows the semiconductor die 100 after formation of the interlayer dielectric 138. In one embodiment, the interlayer dielectric 138 is formed by depositing an ILD (interlayer dielectric) such as an oxide and/or nitride on the first main surface 118 of the silicon substrate 102, planarizing the ILD material (e.g., CMP) to define the interlayer dielectric 138, forming a patterned photoresist on the interlayer dielectric 138, and etching contact openings 334 through the interlayer dielectric 138 and which are defined by the patterned photoresist. The contact openings 334 may extend into the silicon substrate 102 in the first and/or second device regions 104, 106, e.g., as shown in FIG. 7L.

FIG. 7M shows the semiconductor die 100 after the n+ body contact regions 134 and the p+ drift contact regions 140 are formed in the second device region 106 and the p+ body contact regions 161 are formed in the first device region 104. The p+ drift contact regions 140 in the second device region 106 and the p+ body contact regions 161 in the first device region 104 may be masked during implantation of the n+ body contact regions 134 in the second device region 106. The n+ body contact regions 134 in the second device region 106 may be masked during implantation of the p+ drift contact regions 140 in the second device region 106 and the p+ body contact regions 161 in the first device region 104.

FIG. 7N shows the semiconductor die 100 after filling the contact openings 334 with an electrically conductive material to form the respective vias 137, 143, 163 in the first and second device regions 104, 106, and after forming the power metallizations 136, 162 on the interlayer dielectric 138. In one embodiment, the respective vias 137, 143, 163 in the first and second device regions 104, 106 are formed by depositing a Ti/TiN liner and tungsten by CVD, followed by planarization (e.g., CMP) of the tungsten. An oxide 336 may be formed on the vias 143 in the second device region 106 that are at a different electric potential than the source/body vias 137, to precent shorting to the source power metallization 136. The power metallizations 136, 142, 162, 166 formed on the interlayer dielectric 138 may be patterned, e.g., to yield the driver and power transistor connections shown in FIG. 6.

Although the present disclosure is not so limited, the following numbered examples demonstrate one or more aspects of the disclosure.

Example 1. A semiconductor die, comprising: a silicon substrate; a trench gate NMOS transistor formed in a first device region of the silicon substrate; a trench gate PMOS transistor formed in a second device region of the silicon substrate and electrically connected to the trench gate NMOS transistor; and an isolation structure interposed between the first device region and the second device region.

Example 2. The semiconductor die of example 1, wherein the trench gate NMOS transistor is a high-side switch device or a low-side switch device of a power converter circuit, and wherein the trench gate PMOS transistor forms part of a stage of a gate driver for the trench gate NMOS transistor.

Example 3. The semiconductor die of example 1, wherein the trench gate PMOS transistor and the trench gate NMOS transistor form a stage of a gate driver, and wherein at least one additional stage of the gate driver is not integrated in the semiconductor die.

Example 4. The semiconductor die of any of examples 1 through 3, wherein the trench gate PMOS transistor comprises: a p-type drift region in the second device region; a plurality of first stripe-shaped gate trenches extending from a first main surface of the silicon substrate and terminating at a depth in the p-type drift region; a gate electrode in each of the first stripe-shaped gate trenches and dielectrically insulated from the silicon substrate by a gate dielectric; an n-type body region at a first sidewall of each of the first stripe-shaped gate trenches; a p-type source region arranged above the n-type body region at the first sidewall of each of the first stripe-shaped gate trenches; and a p-type drain region at a second sidewall of each of the first stripe-shaped gate trenches opposite the first sidewall.

Example 5. The semiconductor die of example 4, wherein the gate dielectric is thicker at the second sidewall of each of the first stripe-shaped gate trenches than at the first sidewall.

Example 6. The semiconductor die of example 4 or 5, wherein for each of the first stripe-shaped gate trenches, the gate electrode laterally terminates closer to the first sidewall than to the second sidewall such that the gate electrode is laterally separated from the p-type drain region at the second sidewall by a larger distance than from the p-type source region at the first sidewall.

Example 7. The semiconductor die of any of examples 4 through 6, wherein the first main surface of the silicon substrate is recessed adjacent the second sidewall of the first stripe-shaped gate trenches such that the p-type drain regions are arranged deeper in the silicon substrate than the gate electrodes.

Example 8. The semiconductor die of any of examples 4 through 7, wherein the trench gate PMOS transistor further comprises: a field electrode below the gate electrode in each of the first stripe-shaped gate trenches and dielectrically insulated from the silicon substrate by a field dielectric.

Example 9. The semiconductor die of any of examples 4 through 8, wherein the p-type drain region arranged at the second sidewall of each of the first stripe-shaped gate trenches is electrically connected to a gate terminal of the trench gate NMOS transistor.

Example 10. The semiconductor die of example 9, wherein the p-type source region arranged at the first sidewall of each of the first stripe-shaped gate trenches is electrically connected to a positive DC voltage input terminal of the semiconductor die.

Example 11. The semiconductor die of any of examples 4 through 10, wherein the trench gate NMOS transistor comprises: an n-type drift region in the first device region; a plurality of second stripe-shaped gate trenches extending from the first main surface of the silicon substrate and terminating at a depth in the n-type drift region; a gate electrode in each of the second stripe-shaped gate trenches and dielectrically insulated from the silicon substrate by a gate dielectric; a p-type body region at a first sidewall of each of the second stripe-shaped gate trenches; an n-type source region arranged above the p-type body region at the first sidewall of each of the second stripe-shaped gate trenches; and an n-type drain region.

Example 12. The semiconductor die of example 11, wherein the n-type drain region is arranged at a second sidewall of each of the second stripe-shaped gate trenches opposite the first sidewall.

Example 13. The semiconductor die of example 11, wherein the n-type drain region is arranged at a second main surface of the silicon substrate opposite the first main surface.

Example 14. The semiconductor die of any of examples 11 through 13, wherein the p-type drain regions of the trench gate PMOS transistor are electrically connected to the gate electrodes in the second stripe-shaped gate trenches.

Example 15. The semiconductor die of any of examples 1 through 14, wherein the trench gate NMOS transistor is a power NMOSFET (n-channel metal-oxide-semiconductor field-effect transistor).

Example 16. A method of fabricating a semiconductor die, the method comprising: forming a trench gate NMOS transistor in a first device region of a silicon substrate; forming a trench gate PMOS transistor in a second device region of the silicon substrate; forming an isolation structure between the first device region and the second device region; and electrically connecting the trench gate PMOS transistor to the trench gate NMOS transistor.

Example 17. The method of example 16, wherein forming the trench gate PMOS transistor in the second device region comprises: forming a p-type drift region in the second device region; forming a plurality of first stripe-shaped gate trenches that extend from a first main surface of the silicon substrate and terminate at a depth in the p-type drift region; forming a gate electrode in each of the first stripe-shaped gate trenches and dielectrically insulated from the silicon substrate by a gate dielectric; forming an n-type body region at a first sidewall of each of the first stripe-shaped gate trenches; forming a p-type source region above the n-type body region at the first sidewall of each of the first stripe-shaped gate trenches; and forming a p-type drain region at a second sidewall of each of the first stripe-shaped gate trenches opposite the first sidewall.

Example 18. The method of example 17, wherein forming the trench gate NMOS transistor in the first device region comprises: forming an n-type drift region in the first device region; forming a plurality of second stripe-shaped gate trenches that extend from the first main surface of the silicon substrate and terminate at a depth in the n-type drift region; forming a gate electrode in each of the second stripe-shaped gate trenches and dielectrically insulated from the silicon substrate by a gate dielectric; forming a p-type body region at a first sidewall and a second sidewall of each of the second stripe-shaped gate trenches; forming an n-type source region above the p-type body region at the first sidewall and the second sidewall of each of the second stripe-shaped gate trenches; and forming an n-type drain region at a second main surface of the silicon substrate opposite the first main surface.

Example 19. The method of example 18, wherein the second sidewall of adjacent ones of the first stripe-shaped gate trenches face one another, and wherein forming the p-type drain region at the second sidewall of each of the first stripe-shaped gate trenches comprises: etching a recess into the first main surface of the silicon substrate such that the silicon substrate has a recessed part between the second sidewall of adjacent ones of the first stripe-shaped gate trenches; and implanting a p-type dopant species into the recessed part of the silicon substrate.

Example 20. The method of example 19, wherein the second stripe-shaped gate trenches extend deeper into the semiconductor substrate than the first stripe-shaped gate trenches, wherein a field electrode is arranged below the gate electrode in each of the second stripe-shaped gate trenches and dielectrically insulated from the silicon substrate by a field dielectric, and wherein the first stripe-shaped gate trenches are devoid of a field electrode.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor die, comprising:
a silicon substrate;
a trench gate NMOS transistor formed in a first device region of the silicon substrate;
a trench gate PMOS transistor formed in a second device region of the silicon substrate and electrically connected to the trench gate NMOS transistor; and
an isolation structure interposed between the first device region and the second device region,
wherein the trench gate PMOS transistor comprises:
a p-type drift region in the second device region;
a plurality of first stripe-shaped gate trenches extending from a first main surface of the silicon substrate and terminating at a depth in the p-type drift region, each of the first stripe-shaped gate trenches having a first sidewall and a second sidewall opposite the first sidewall;
a gate electrode in each of the first stripe-shaped gate trenches and dielectrically insulated from the silicon substrate by a gate dielectric;
an n-type body region at the first sidewall of each of the first stripe-shaped gate trenches;
a p-type source region arranged above the n-type body region at the first sidewall of each of the first stripe-shaped gate trenches; and
a p-type drain region arranged closer to the second sidewall of each of the first stripe-shaped gate trenches than the first sidewall.

2. The semiconductor die of claim 1, wherein the trench gate NMOS transistor is a high-side switch device or a low-side switch device of a power converter circuit, and wherein the trench gate PMOS transistor forms part of a stage of a gate driver for the trench gate NMOS transistor.

3. The semiconductor die of claim 1, wherein the trench gate PMOS transistor and the trench gate NMOS transistor form a stage of a gate driver, and wherein at least one additional stage of the gate driver is not integrated in the semiconductor die.

4. The semiconductor die of claim 1, wherein the gate dielectric is thicker at the second sidewall of each of the first stripe-shaped gate trenches than at the first sidewall.

5. The semiconductor die of claim 1, wherein for each of the first stripe-shaped gate trenches, the gate electrode laterally terminates closer to the first sidewall than to the second sidewall such that the gate electrode is laterally separated from the p-type drain region at the second sidewall by a larger distance than from the p-type source region at the first sidewall.

6. The semiconductor die of claim 1, wherein the first main surface of the silicon substrate is recessed adjacent the second sidewall of the first stripe-shaped gate trenches such that the p-type drain regions are arranged deeper in the silicon substrate than the gate electrodes.

7. The semiconductor die of claim 1, wherein the trench gate PMOS transistor further comprises:
a field electrode below the gate electrode in each of the first stripe-shaped gate trenches and dielectrically insulated from the silicon substrate by a field dielectric.

8. The semiconductor die of claim 1, wherein the p-type drain region arranged at the second sidewall of each of the first stripe-shaped gate trenches is electrically connected to a gate terminal of the trench gate NMOS transistor.

9. The semiconductor die of claim 8, wherein the p-type source region arranged at the first sidewall of each of the first stripe-shaped gate trenches is electrically connected to a positive DC voltage input terminal of the semiconductor die.

10. The semiconductor die of claim 1, wherein the trench gate NMOS transistor comprises:
an n-type drift region in the first device region;
a plurality of second stripe-shaped gate trenches extending from the first main surface of the silicon substrate and terminating at a depth in the n-type drift region;
a gate electrode in each of the second stripe-shaped gate trenches and dielectrically insulated from the silicon substrate by a gate dielectric;
a p-type body region at a first sidewall of each of the second stripe-shaped gate trenches;
an n-type source region arranged above the p-type body region at the first sidewall of each of the second stripe-shaped gate trenches; and
an n-type drain region.

11. The semiconductor die of claim 10, wherein the n-type drain region is arranged at a second sidewall of each of the second stripe-shaped gate trenches opposite the first sidewall.

12. The semiconductor die of claim 10, wherein the n-type drain region is arranged at a second main surface of the silicon substrate opposite the first main surface.

13. The semiconductor die of claim 10, wherein the p-type drain regions of the trench gate PMOS transistor are electrically connected to the gate electrodes in the second stripe-shaped gate trenches.

14. The semiconductor die of claim 1, wherein the trench gate NMOS transistor is a power NMOSFET (n-channel metal-oxide-semiconductor field-effect transistor).

15. A method of fabricating a semiconductor die, the method comprising:
forming a trench gate NMOS transistor in a first device region of a silicon substrate;
forming a trench gate PMOS transistor in a second device region of the silicon substrate;
forming an isolation structure between the first device region and the second device region; and
electrically connecting the trench gate PMOS transistor to the trench gate NMOS transistor,
wherein forming the trench gate PMOS transistor comprises:
forming a p-type drift region in the second device region;
forming a plurality of first stripe-shaped gate trenches that extend from a first main surface of the silicon substrate and terminate at a depth in the p-type drift region, each of the first stripe-shaped gate trenches having a first sidewall and a second sidewall opposite the first sidewall;
forming a gate electrode in each of the first stripe-shaped gate trenches and dielectrically insulated from the silicon substrate by a gate dielectric;
forming an n-type body region at the first sidewall of each of the first stripe-shaped gate trenches;

15 forming a p-type source region above the n-type body region at the first sidewall of each of the first stripe-shaped gate trenches; and forming a p-type drain region closer to the second sidewall of each of the first stripe-shaped gate trenches than the first sidewall.

16. The method of claim 15, wherein forming the trench gate NMOS transistor in the first device region comprises:

forming an n-type drift region in the first device region;

forming a plurality of second stripe-shaped gate trenches that extend from the first main surface of the silicon substrate and terminate at a depth in the n-type drift region;

forming a gate electrode in each of the second stripe-shaped gate trenches and dielectrically insulated from the silicon substrate by a gate dielectric;

forming a p-type body region at a first sidewall and a second sidewall of each of the second stripe-shaped gate trenches;

forming an n-type source region above the p-type body region at the first sidewall and the second sidewall of each of the second stripe-shaped gate trenches; and forming an n-type drain region at a second main surface of the silicon substrate opposite the first main surface.

17. The method of claim 16, wherein the second sidewall of adjacent ones of the first stripe-shaped gate trenches face one another, and wherein forming the p-type drain region at the second sidewall of each of the first stripe-shaped gate trenches comprises:

16 etching a recess into the first main surface of the silicon substrate such that the silicon substrate has a recessed part between the second sidewall of adjacent ones of the first stripe-shaped gate trenches; and implanting a p-type dopant species into the recessed part of the silicon substrate.

18. The method of claim 17, wherein the second stripe-shaped gate trenches extend deeper into the semiconductor substrate than the first stripe-shaped gate trenches, wherein a field electrode is arranged below the gate electrode in each of the second stripe-shaped gate trenches and dielectrically insulated from the silicon substrate by a field dielectric, and wherein the first stripe-shaped gate trenches are devoid of a field electrode.

19. A semiconductor die, comprising:

a silicon substrate;

a trench gate NMOS transistor formed in a first device region of the silicon substrate;

a trench gate PMOS transistor formed in a second device region of the silicon substrate and electrically connected to the trench gate NMOS transistor; and an isolation structure interposed between the first device region and the second device region, wherein the trench gate PMOS transistor and the trench gate NMOS transistor form a stage of a gate driver, wherein at least one additional stage of the gate driver is not integrated in the semiconductor die.

* * * * *